US011018300B2

(12) United States Patent
Pirovano et al.

(10) Patent No.: US 11,018,300 B2
(45) Date of Patent: May 25, 2021

(54) SELF-ALIGNED MEMORY DECKS IN CROSS-POINT MEMORY ARRAYS

(71) Applicant: Micron Technology, Inc., Boise, ID (US)

(72) Inventors: Agostino Pirovano, Milan (IT); Fabio Pellizzer, Boise, ID (US); Anna Maria Conti, Milan (IT); Andrea Redaelli, Casatenovo (IT); Innocenzo Tortorelli, Cernusco Sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/665,955

(22) Filed: Oct. 28, 2019

(65) Prior Publication Data

US 2020/0075858 A1    Mar. 5, 2020

Related U.S. Application Data

(62) Division of application No. 15/660,829, filed on Jul. 26, 2017, now Pat. No. 10,510,957.

(51) Int. Cl.
*H01L 45/00* (2006.01)
*H01L 27/24* (2006.01)

(52) U.S. Cl.
CPC ...... *H01L 45/1675* (2013.01); *H01L 27/2481* (2013.01); *H01L 45/06* (2013.01);
(Continued)

(58) Field of Classification Search
CPC ............. H01L 45/1675; H01L 45/1233; H01L 27/2427; H01L 27/2463; H01L 27/2481
See application file for complete search history.

(56) References Cited

U.S. PATENT DOCUMENTS

| 7,009,208 B2 | 3/2006 | Aratani et al. |
| 7,236,394 B2 | 6/2007 | Chen et al. |

(Continued)

FOREIGN PATENT DOCUMENTS

| KR | 20120050870 A | 5/2012 |
| KR | 20130010915 A | 1/2013 |

(Continued)

OTHER PUBLICATIONS

ISA/KR, International Search Report and Written Opinion of the International Searching Authority, Int'l. Appl. No. PCT/US2018/043150, dated Nov. 6, 2018, Korean Intellectual Property Office, Seo-gu, Daejeon, Republic of Korea, 19 pgs.

(Continued)

*Primary Examiner* — Allison Bernstein
(74) *Attorney, Agent, or Firm* — Holland & Hart LLP

(57) ABSTRACT

A multi-layer memory device with an array having multiple memory decks of self-selecting memory cells is provided in which N memory decks may be fabricated with N+1 mask operations. The multiple memory decks may be self-aligned and certain manufacturing operations may be performed for multiple memory decks at the same time. For example, patterning a bit line direction of a first memory deck and a word line direction in a second memory deck above the first memory deck may be performed in a single masking operation, and both decks may be etched in a same subsequent etching operation. Such techniques may provide efficient fabrication which may allow for enhanced throughput, additional capacity, and higher yield for fabrication facilities relative to processing techniques in which each memory deck is processed using two or more mask and etch operations per memory deck.

17 Claims, 17 Drawing Sheets

(52) U.S. Cl.
CPC .......... *H01L 45/08* (2013.01); *H01L 45/1233* (2013.01); *H01L 27/2409* (2013.01); *H01L 27/2427* (2013.01); *H01L 45/141* (2013.01)

(56) References Cited

U.S. PATENT DOCUMENTS

| | | |
|---|---|---|
| 8,105,867 B2 | 1/2012 | Matamis et al. |
| 8,274,068 B2 | 9/2012 | Nagashima |
| 8,432,720 B2 | 4/2013 | Awaya et al. |
| 8,605,495 B2 | 12/2013 | Lung |
| 2009/0283739 A1 | 11/2009 | Kiyotoshi |
| 2014/0138607 A1 | 5/2014 | Ito et al. |
| 2016/0181321 A1 | 6/2016 | Jung et al. |
| 2016/0260776 A1 | 9/2016 | Lee et al. |
| 2017/0125097 A1 | 5/2017 | Tortorelli et al. |

FOREIGN PATENT DOCUMENTS

| | | |
|---|---|---|
| TW | 425561 B | 3/2001 |
| TW | 200411903 A | 7/2004 |
| TW | 201027713 A | 7/2010 |
| TW | 201101465 A | 1/2011 |
| TW | 201112399 A | 4/2011 |
| TW | 201250992 A | 12/2012 |
| TW | 201407842 A | 2/2014 |

OTHER PUBLICATIONS

Chen, et al., "An Access-Transistor-Free (0T/1R) Non-Volatile Resistance Random Access Memory (RRAM) Using a Novel Threshold Switching, Self-Rectifying Chalcogenide Device", Electron Devices Meeting, 2003. IEDM '03.
Technical Digest. IEEE International, Dec. 8-10, 2003, IEEE, 4 pgs.
IPO, "Office Action," issued in connection with ROC (Taiwan) Patent Application No. 107125455, dated Feb. 24, 2020 (12 pages).

SELF-ALIGNED MEMORY DECKS IN CROSS-POINT MEMORY ARRAYS

CROSS REFERENCE

The present Application for Patent is a divisional of and claims priority to and the benefit of U.S. patent application Ser. No. 15/660,829 by Pirovano et al., entitled "Self-Aligned Memory Decks in Cross-Point Memory Arrays," filed Jul. 26, 2017, which is assigned to the assignee hereof and expressly incorporated by reference in its entirety herein.

BACKGROUND

The following relates generally to multi-layer memory arrays and more specifically to self-aligned memory decks in cross-point memory arrays in which N memory decks may use N+1 patterning and etch operations.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), and others. Memory devices may be volatile or non-volatile. Non-volatile memory, e.g., flash memories or FeRAM, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics. Some types of memory devices may use variations in resistance or voltage drop across a cell to program and sense different logic states. For example, self-selecting memory may leverage ion migration properties in a cell.

Fabricating a memory device may include forming, patterning, and removing material according to patterns that define portions of the memory device. Fabrication is generally performed in clean rooms using highly specialized fabrication equipment, and fabrication facilities are often referred to as "wafer fabs" or "semiconductor fabs." Such fabrication facilities and associated equipment require substantial capital investment, and thus efficient manufacturing may enhance the throughput and utilization of such facilities.

DETAILED DESCRIPTION

A multi-layer memory device with an array having multiple memory decks of self-selecting memory cells in which N memory decks may be fabricated with N+1 mask operations. Techniques discussed herein may allow for improved manufacturing efficiency and reduced manufacturing cost. Additionally, the multiple memory decks may be self-aligned and certain manufacturing operations may be performed for multiple memory decks at the same time. In some cases, patterning a bit line direction of a first memory deck and a word line direction in a second memory deck above the first memory deck may be performed in a single masking operation, and both decks may be etched in a subsequent etching operation. Such techniques may provide efficient fabrication which may allow for enhanced throughput and additional capacity for fabrication facilities relative to processing techniques in which each memory deck is processed using two or more mask and etch operations. Furthermore, fewer processing steps may also reduce the likelihood of defects in memory decks, which may increase yield.

Self-selecting memory may leverage ion migration properties of phase change materials for programming and subsequently sensing a logic state. A self-selecting memory cell may include a memory storage element surrounded by a first electrode and a second electrode. Self-selecting memory is a crossbar memory element that comprises one single element that works for selection and storage. Non-linear current voltage characteristics allow the memory element to be used as selector with a low voltage off region and a high voltage on state, similar to a diode. At the same time, the current voltage characteristics show at least two programmable states, thus behaving as a memory element. Self-selecting memory may be employed, in some examples, for relatively time-sensitive operations, such as random access memory (RAM) tasks.

In some examples, a cell of a first crossbar memory array and a cell of second crossbar memory array stacked on the first crossbar memory array may be operated as a multilevel cell. A multilevel cell (MLC) may contain two or more physical mechanisms (e.g., memory elements), each separated by an electrode and may allow more than two data (e.g., multiple bits) to be stored.

Features and techniques introduced above are further described below in the context of a memory array having multiple decks of memory cells. Specific examples are then described for fabricating multi-layer memory arrays that include self-selecting memory cells, although techniques discussed herein may be used for other phase change memory cells (e.g., a phase change memory cell that includes a phase change material (PCM) element and a separate selection element). These and other features of the disclosure are further illustrated by and described with reference to apparatus diagrams, system diagrams, and flowcharts.

Figure 1:
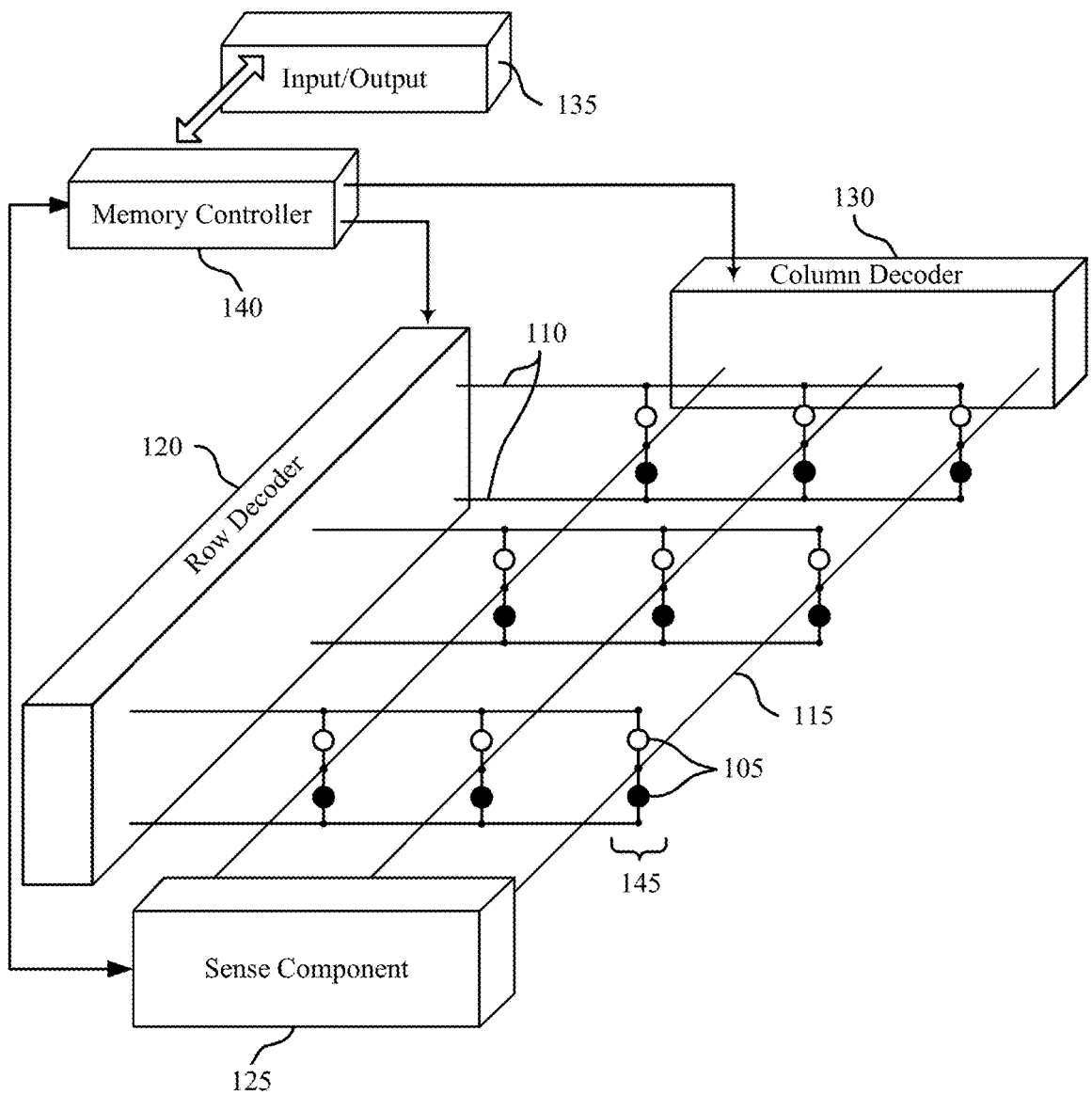
FIG. 1 illustrates an example of a memory array that supports self-aligned memory decks in cross-point memory arrays in accordance with aspects of the present disclosure.

FIG. 1 illustrates an example memory array 100 in accordance with various embodiments of the present disclosure. Memory array 100 may also be referred to as an electronic memory apparatus. Memory array 100 includes memory cells 105 that are programmable to store different states. Each memory cell 105 may be programmable to store two states, denoted as a logic 0 and a logic 1. In some cases, memory cell 105 is configured to store more than two logic states.

A memory cell 105 may include a material, which may be referred to as a memory element or memory storage element, that has a variable and configurable electrical resistance that is representative of the logic states. For example, a crossbar memory cell may include a memory element with a material in an amorphous state, and that may have a threshold voltage associated with it—that is, current flows after the threshold voltage is exceed. Different threshold voltages may allow SET versus RESET states to be distinguished.

Memory array 100 may be a three-dimensional (3D) memory array, where two-dimensional (2D) memory arrays are formed on top of one another. This may increase the number of memory cells that may formed on a single die or substrate as compared with 2D arrays, which in turn may reduce production costs or increase the performance of the memory array, or both. According to the example depicted in FIG. 1, memory array 100 includes two levels (which may also be referred to, in some examples, as "layers") of memory cells 105 and may thus be considered a three-dimensional memory array; however, the number of levels is not limited to two. Each level may be aligned or positioned so that memory cells 105 may be aligned with one another across each level, forming a memory cell stack 145.

Each row of memory cells 105 is connected to a word line 110, and each column of memory cells 105 is connected to a bit line 115. Word lines 110 and bit lines 115 may be substantially perpendicular to one another to create an array. As shown in FIG. 1, the two memory cells 105 in a memory cell stack 145 may share a common access line such as a bit line 115. That is, a bit line 115 may be in electronic communication with the bottom electrode of the upper memory cell 105 and the top electrode of the lower memory cell 105. Other configurations may be possible, for example, a third layer may share a word line 110 with a lower layer. In general, one memory cell 105 may be located at the intersection of two access lines such as a word line 110 and a bit line 115. This intersection may be referred to as a memory cell's address. A target memory cell 105 may be a memory cell 105 located at the intersection of an energized word line 110 and bit line 115; that is, a word line 110 and a bit line 115 may be energized in order to read or write a memory cell 105 at their intersection. Other memory cells 105 that are in electronic communication with (e.g., connected to) the same word line 110 or bit line 115 may be referred to as untargeted memory cells 105.

As discussed above, electrodes may be coupled to a memory cell 105 and an word line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory array 100.

Operations such as reading and writing may be performed on memory cells 105 by activating or selecting word line 110 and digit line 115. Word lines 110 may also be known as row lines 110, and bit lines 115 may also be known digit lines 115. References to word lines and bit lines, or their analogues, are interchangeable without loss of understanding or operation, and word lines and bit lines may be referred to generally as access lines. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 receives a column address from the memory controller 140 and activates the appropriate digit line 115. For example, memory array 100 may include multiple word lines 110, labeled WL_1 through WL_M, and multiple bit lines 115, labeled BL_1 through BL_N, where M and N depend on the array size. Thus, by activating a word line 110 and a bit line 115, e.g., WL_2 and BL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the total threshold voltage of the memory cell 105.

Sense component 125 may include various transistors or amplifiers in order to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120.

The memory controller 140 may control the operation (e.g., read, write, re-write, refresh, decharge, etc.) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory array 100. For example, it may apply discharge voltages to a word line 110 or digit line 115 after accessing one or more memory cells 105. In general, the amplitude, shape, or duration of an applied voltage or current discussed herein may be adjusted or varied and may be different for the various operations discussed in operating memory array 100. Furthermore, one, multiple, or all memory cells 105 within memory array 100 may be accessed simultaneously; for example, multiple or all cells of memory array 100 may be accessed simultaneously during a reset operation in which all memory cells 105, or a group of memory cells 105, are set to a single logic state.

Figure 2:
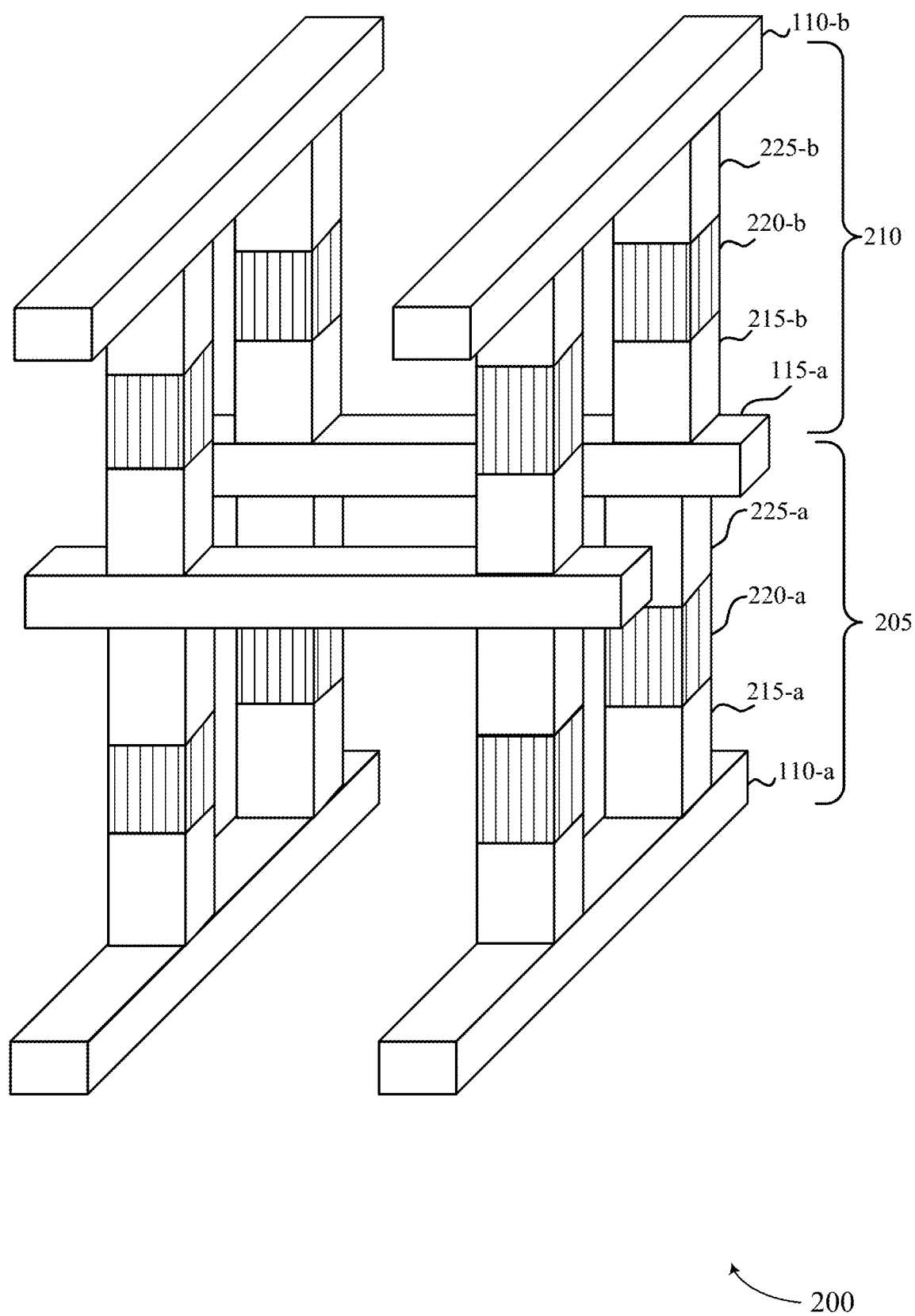
FIG. 2 illustrates an example of self-aligned memory decks in a cross-point memory array in accordance with aspects of the present disclosure.

FIG. 2 illustrates an embodiment of a multi-layer cross point memory device that supports features and operations in accordance with examples of the present disclosure. Memory device 200 may be an example of portions of memory array 100 described with reference to FIG. 1. Memory device 200 may include a first array or deck 205 of cells and second array or deck 210 of cells on top of the first array. Memory device 200 may also include word line 110-*a* and word line 110-*b*, and bit line 115-*a*, which may be examples of word line 110 and bit line 115, as described with reference to FIG. 1. Memory cells of the second deck 210 of cells may have a self-selecting memory storage element and may overlie corresponding memory cells of the first deck 205 of cells.

Memory cells of the first deck 205 of cells may include first electrode layer 215-*a*, memory storage element layer 220-*a*, and second electrode layer 225-*a*. Second memory deck 210 may include a separate deck of memory cells, that may include a first electrode layer 215-*b*, memory storage element layer 220-*b*, and second electrode layer 225-*b*. In other embodiments, other structures may be fabricated, such as a structure in which one or more electrode (e.g., carbon) layers are only defined along one direction (e.g., the WL and/or the BL direction). For example, such an alternative structure may be implemented by performing the electrode layer deposition and array patterning according to a modified sequence, to deposit word line 110-*a*, first electrode layer 215-*a* and memory storage element layer 220-*a*; patterning along the word line (110-*a*) direction before depositing second electrode layer 225-*a*, bit line 115-*a* layer, electrode layer 215-*b* and self-selecting memory storage element layer 220-*b*; and patterning along the bit line (115-*a*) direction, interrupting the patterning etch after the self-selecting memory material is defined in both directions. At this point there may still be portions of the electrode layer 215-*a* adjacent to word line 110-*a* that is continuous in the wordline direction (which may act as a shunt to the wordline). Additionally, in such an embodiment, the electrode layers adjacent to the bit line 115-*a* may act as shunts to the bit line 115-*a* itself (e.g., extending in one direction and in continuous lines in the bit line direction). In some cases, the electrode material may be completely avoided.

The memory cells of the first deck 205 of cells and second deck 210 of cells may, in some examples, have common conductive lines such that corresponding cells of each deck 205 and 210 of cells may share bit lines 115 or word lines 110 as described with reference to FIG. 1. For example, first electrode layer 215-*b* of the second deck of cells and the second electrode layer 225-*a* of the first deck 205 of cells may be coupled to bit line 115-*a* such that bit line 115-*a* is shared by vertically adjacent memory cells.

The architecture of memory device 200 may be referred to as a cross-point architecture. It may also be referred to as a pillar structure. For example, as shown in FIG. 2, a pillar (e.g., first memory deck 205 that includes first memory cells) may be in contact with a first conductive line (e.g., word line 110-*a*) and a second conductive line (e.g., bit line 115-*a*), where pillars of the first memory deck 205 comprises first electrode layer 215-*a*, memory storage element layer 220-*a*, and second electrode layer 225-*a*. Correspondingly, pillars of the second memory deck 210 may be in contact with a first conductive line (e.g., bit line 115-*a*) and a second conductive line (e.g., word line 110-*b*) and may include first electrode layer 215-*b*, memory storage element layer 220-*b* and second electrode layer 225-*b*.

Such a pillar architecture may offer relatively high-density data storage with lower production costs compared to other memory architectures. For example, the cross-point architecture may have memory cells with a reduced area and, resultantly, an increased memory cell density compared to other architectures. For example, the architecture may have a $4F^2$ memory cell area, where F is the smallest feature size, compared to other architectures with a $6F^2$ memory cell area, such as those with a three-terminal selection. For example, DRAM may use a transistor, which is a three-terminal device, as the selection component for each memory cell and may have a larger memory cell area compared to the pillar architecture.

As mentioned, multiple memory cells may be referred to as a memory array. So the first array may be or may include a first deck of a three-dimensional cross point memory architecture and the second array may include a second deck of the three-dimensional cross point memory architecture. The first deck may and the second deck may have a first pitch or aspect ratio that is reduced relative to PCM memory cells that may have both a memory storage element and a selection device. In some cases, different decks may be characterized by different pitches in the two directions. For example, the cross-section in a top view of the storage element, and possibly the associated pillar, may be a rectangle rather than a square (e.g., each pair of opposite sides being self-aligned to a respective etching mask, such as either in wordline or bitline direction). Such different pitches may be obtained by different hard masking dimensions or by lateral over-etch during patterning, for example. Other top view cross-sections may also be possible, such as elliptic or circular elements and possibly associated pillars.

While the example of FIG. 2 shows two memory decks, other configurations are possible. For example, a three or four memory decks may be configured in a similar manner in a three-dimensional cross point architecture. In some examples, one or more of the memory decks may include PCM cells that include both a phase change memory storage device and a selection device. For example, four decks of memory arrays may be present, with a lowest deck including PCM cells, the middle two decks including self-selecting memory cells, and the highest deck including PCM cells. In some embodiments, one or more the PCM decks may be above wordlines or bitlines (e.g., PCM cells are on off decks and self-selecting memory cells are on even decks, or vice-versa), such that the PCM cells and the self-selecting memory cells may be addressed in the same way. The aspect ratio of the decks of self-selecting memory cells may be such that common patterning and etching steps may be used for the self-selecting memory decks, as discussed in more detail below. Memory storage element layers 220 may, for example, include a chalcogenide glass such as, for example, an alloy of selenium (Se), tellurium (Te), arsenic (As), antimony (Sb), carbon (C), germanium (Ge), and silicon (Si).

Memory device 200 may be made by various combinations of material formation and removal. For example, layers of material may be deposited that correspond to the word line 110-a, first electrode layer 215-a, memory storage element layer 220-a, second electrode layer 225-a, bit line 115-a, first electrode layer 215-b, memory storage element layer 220-b, second electrode layer 225-b, and word line 110-b. Material may be selectively removed to then create the desired features, such as the pillar structure depicted in FIG. 2, as will be discussed in more detail with respect to FIGS. 4 through 13. The electrode layers may be formed of, for example, carbon, although other materials may be used for the electrode layers, such as any adhesion or barrier layer material (e.g., W, Ti, TiN, Cr, Ni, Ta, etc., or combinations thereof).

A memory device having the pillar structure illustrated in FIG. 2 and fabricated according to techniques may provide a number of benefits over a memory device that uses a separate PCM memory element and selection device element (both of which may include chalcogenide glass). For example, the pillar structure of memory device 200 provides a reduced aspect ratio of the cell stack, and in some cases the resulting thickness may be less than half of a memory cell that includes both a PCM memory element and selection device. Additionally, self-selecting memory devices such as in memory device 200 may have metallization layers for access lines (e.g., bit lines and word lines) with reduced thickness relative to memory cells that include both a PCM memory element and selection device, as self-selecting memory devices use the polarity effect as discussed above which may be achieved with relatively low currents (e.g., 20% to 30% of the programming currents of PCM memory elements). Thus, metal layer thicknesses can be reduced while maintaining necessary voltage drops in the array.

Furthermore, memory cells that include both a PCM memory element and a selection device may use different compositions of chalcogenide glass for the PCM memory element and the selection device. These different compositions of chalcogenide glass present cross-contamination issues if one of the compositions is exposed to another of the compositions in etching operations, and such cross-contamination may cause significant modification of the electrical properties of the chalcogenide glass layers. Thus, when fabricating memory cells that have both a PCM memory element and a selection device, cross-contamination is prevented through separate etching and sealing sequences that avoid exposure of both chalcogenide glass layers at the same time. The self-selecting memory cell structure uses only a single chalcogenide glass layer in each deck 205 and 210, thus limiting the sources for cross-contamination. Various techniques provided herein allow for fabrication in which separate chalcogenide glass layers in multiple memory decks may be exposed at the same time in an etch operation. As mentioned above, such techniques may provide an N-deck memory array that is fabricated using N+1 mask and etch operations.

Figure 3:
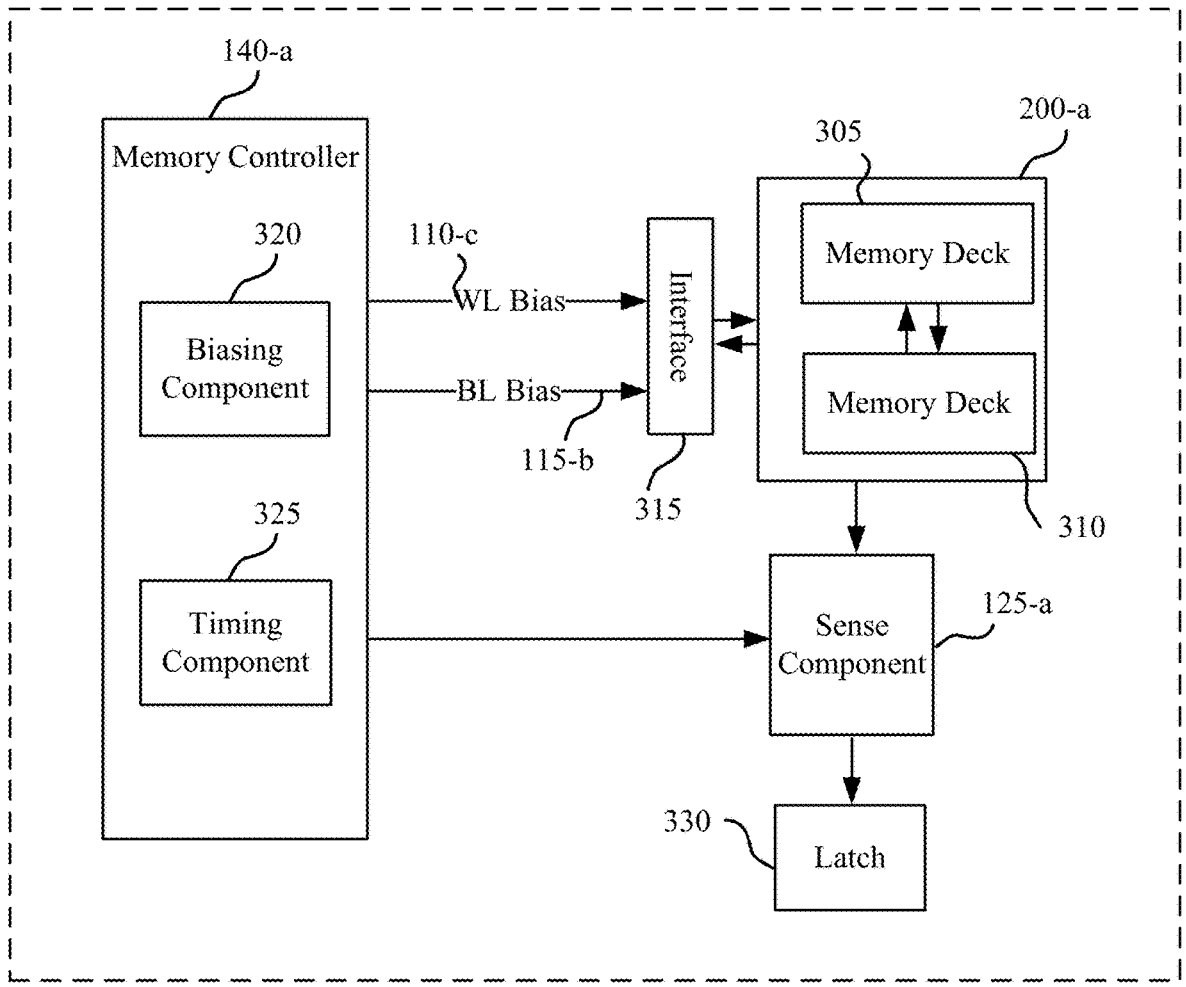
FIG. 3 illustrates a block diagram of a cross point memory device that supports features and operations in accordance with examples of the present disclosure.

FIG. 3 shows an exemplary multi-layer cross point memory device 300 that supports features and operations in accordance with examples of the present disclosure. Device 300 may be referred to as an electronic memory apparatus. Memory device 200-a may include a first memory deck 305 and second memory deck 310. First memory deck 305 may include an array of cells similar to first deck 205 described with reference to FIG. 2. Second memory deck 310 may include an array of cells similar to second deck 210 described with reference to FIG. 2. First memory deck 305 may be coupled to second memory deck 310. First memory deck 305 may include a first memory cell that includes a self-selecting memory storage element coupled between a first access line and a second access line, and second memory deck 310 may include a second memory cell that includes a self-selecting memory storage element coupled between the second access line and a third access line. Each self-selecting memory storage element may include a self-selecting memory stack that may include, for example, a layer of carbon, a memory storage element layer, and another layer of carbon. In other embodiments, the self-selecting memory storage elements may have different stacks of materials, and in some embodiments different memory decks may have different stacks of materials. In some embodiments, as discussed above, one or more electrode layers may be defined only along one direction (e.g., the WL and/or the BL direction). Furthermore, in some embodiments, different pitches in the wordline and bitline directions may be present.

Memory device 200-a may be coupled with interface 315 that may be coupled to first memory deck 305 and to word line 110-c and bit line 115-b. Interface 315 may also be referred to as control circuitry and may be oriented such that the first array and the second array overlie interface 315. These components may be in electronic communication with each other and may perform one or more of the functions described herein. In some cases, memory controller 140-a may include biasing component 320 and timing component 325. Memory controller 140-a may be in electronic communication with word line 110-c, bit line 115-b, and sense component 125-a, which may be examples of word line 110, bit line 115, and sense component 125, as described with reference to FIGS. 1 and 2. In some cases, sense component 125-a and latch 330 may be components of memory controller 140-a. These components may also be in electronic communication with other components, both inside and outside of memory array device, in addition to components not listed above, via other components, connections, or busses.

Memory controller 140-a may be configured to activate word line 110-c or bit line 115-b by applying voltages to those various nodes. For example, biasing component 320 may be configured to apply a voltage to operate memory array device to read or write first memory deck 305 and second memory deck 310 as described above. In some cases, memory controller 140-a may include a row decoder, column decoder, or both, as described with reference to FIG. 1. This may enable memory controller 140-a to access one or more memory cells. Biasing component 320 may provide a voltage for the operation of sense component 125-a. In the example of FIG. 3, biasing component 320 is shown as a component of memory controller 140-a; but biasing component 320 may be external to memory controller 140-a. Biasing component 320 may be managed inside a memory chip that includes the first memory deck 305 and the second memory deck 310.

Interface 315 may be coupled to memory controller 140-a via word line 110-c and digit line 115-b. Interface 315 may be configured to write a first logic value to a memory storage element of a cell of the first memory deck 305 (e.g., to memory storage element layer 220-a of FIG. 2). A first state may be written to the first memory deck 305 using a first polarity. Similarly, interface 315 may be configured to write a second logic value to a memory storage element of a cell of the second memory deck 310 (e.g., to memory storage element layer 220-b of FIG. 2). A first state may be written to the second memory deck 310 using a second polarity. The second polarity may be opposite the first polarity.

Interface 315 may be configured to read the first logic value written to a cell of the first memory deck 305 and the second logic value written to the corresponding cell of the second memory deck 310. The logic values may be read using a second polarity, which may be opposite of the first polarity.

In some cases, memory controller 140-a may perform its operations using timing component 325. For example, timing component 325 may control the timing of the various word line selections or plate biasing, including timing for switching and voltage application to perform the memory functions, such as reading and writing, discussed herein. In some cases, timing component 325 may control the time of operations of biasing component 320.

Upon determining a logic state of first memory deck 305 and second memory deck 310, the sense component 125-a may store the output in latch 330, where it may be used in accordance with the operations of an electronic device that includes memory device 300. Sense component 125-a may include a sense amplifier in electronic communication with the latch and memory device 200-a.

Memory controller 140-a, or at least some of its various sub-components may be implemented in hardware, software executed by a processor, firmware, or any combination thereof. If implemented in software executed by a processor, the functions of the memory controller 140-a, or at least some of its various sub-components, may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

The memory controller 140-a, or at least some of its various sub-components, may be physically located at various positions, including being distributed such that portions of functions are implemented at different physical locations by one or more physical devices. In some examples, memory controller 140-a, or at least some of its various sub-components, may be a separate and distinct component in accordance with various examples of the present disclosure. In other examples, memory controller 140-a, or at least some of its various sub-components, may be combined with one or more other hardware components.

Figure 4A:
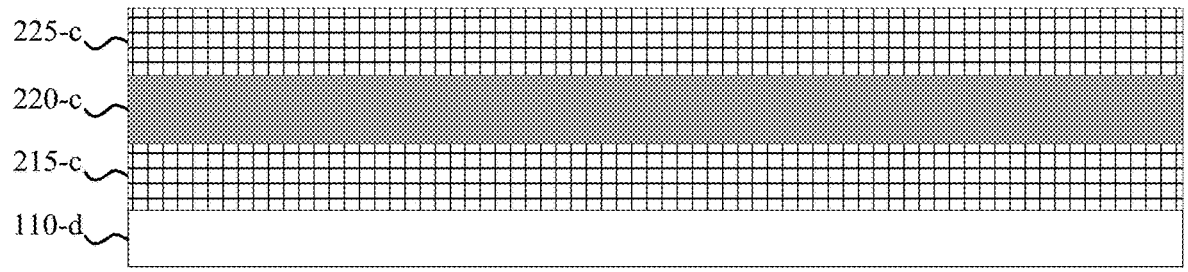
FIGS. 4A and 4B illustrate cross-sections of a portion of a first memory deck during fabrication in accordance with examples of the present disclosure.
Figure 4B:
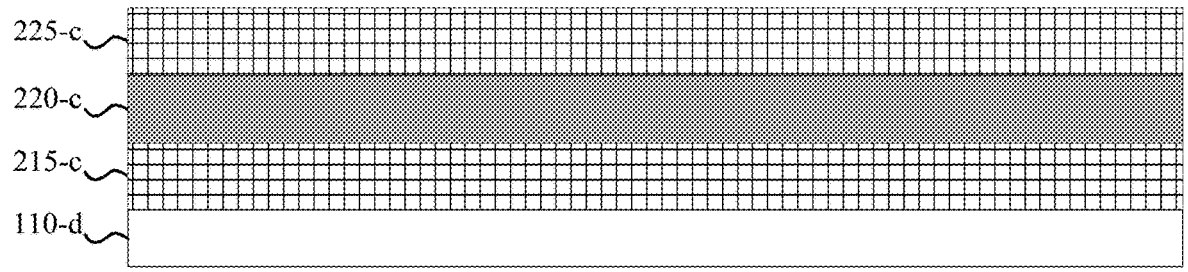

FIGS. 4A and 4B show a portion of a first memory deck of a multi-layer cross point memory device 400 in accordance with examples of the present disclosure. FIG. 4A shows a cross-section of the first memory deck in an X-direction in which a first set of access lines (e.g., word lines 110) may be perpendicular to the X-direction and a second set of access lines (e.g., bit lines 115) may be parallel to the X-direction. Similarly, FIG. 4B shows a cross-section of the first memory deck in a Y-direction in which the first set of access lines (e.g., word lines 110) may be parallel to the Y-direction and the second set of access lines (e.g., bit lines 115) may be perpendicular to the Y-direction. The portion of the first memory deck may be, for example a portion of the first memory deck 205 described with reference to FIG. 2.

In this embodiment, a blanket deposition of a lower electrode metallization layer, which may be used to form the metallization for the word line 110-d layer of the first memory deck, may be deposited on a substrate, followed by formation of a first electrode layer 215-c, memory storage element layer 220-c, and second electrode layer 225-c. These layers may, after processing, be examples of word lines 110 and memory cells 105 of first memory deck 205 as described with reference to FIGS. 1 and 2. Memory storage element layer 220-c may, for example, be a variable resistance material, a chalcogenide, or a phase change material. Word line 110-d layer may be a conductive layer and may include, in some examples, tungsten, aluminum, titanium, titanium nitride, silicon, polysilicon, or any combination thereof. Various techniques may be used to deposit the layers of FIG. 4, such as, for example, chemical vapor deposition (CVD), metal-organic chemical vapor deposition (MOCVD), plasma-enhanced CVD (PECVD), physical vapor deposition (PVD), sputter deposition, atomic layer deposition (ALD), or molecular beam epitaxy (MBE), among other thin film growth techniques. In some examples, the substrate, or a portion thereof, may include other components of a memory device, such as logic circuitry associated with the memory controller 140, interface 315, sense component 125, latch 330, or any combination thereof, as discussed above with reference to FIGS. 1 through 3. In some examples, the substrate, or a portion thereof, may be a silicon substrate, an insulating substrate such as silicon dioxide or silicon nitride, a polysilicon substrate, or any combination thereof.

Figure 5A:
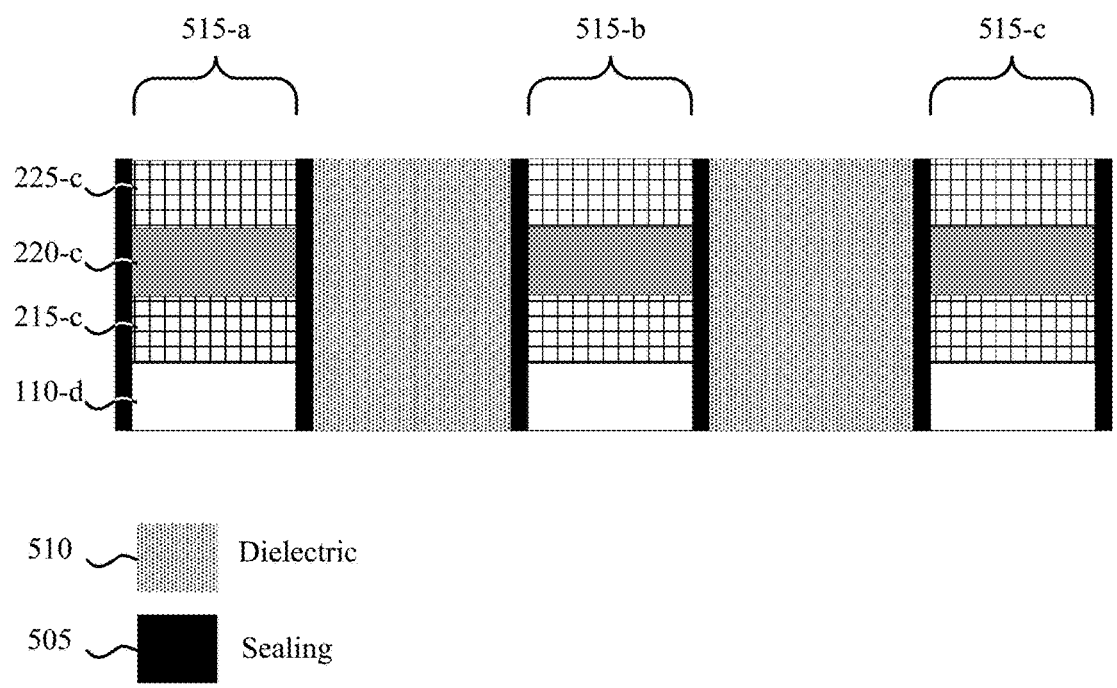
FIGS. 5A and 5B illustrate cross-sections of a portion of the first memory deck following first row processing during fabrication in accordance with examples of the present disclosure.
Figure 5B:
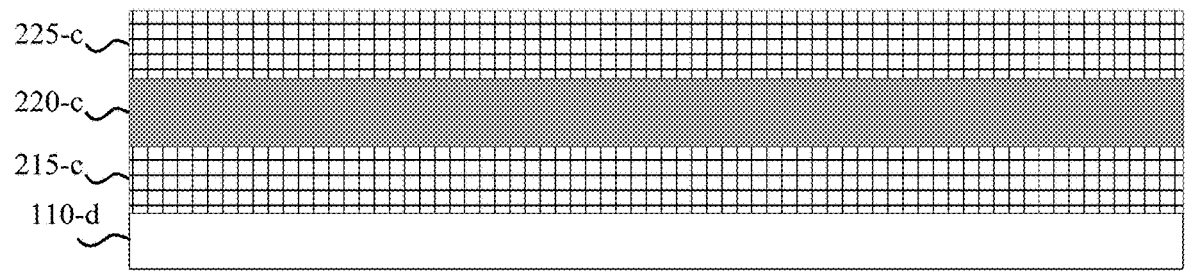

FIGS. 5A and 5B show a portion of a first memory deck of a multi-layer cross point memory device 500 following a first patterning operation, a first etching operation, and a first filling operation in accordance with examples of the present disclosure. FIG. 5A shows the cross-section in the X-direction and FIG. 5B shows the cross-section in the Y-direction, similarly as discussed above with respect to FIGS. 4A and 4B.

In this example, a first set of rows 515 may be patterned on the second electrode layer 225-c in the first patterning operation. The first set of rows 515 may be rows that are patterned to correspond to word lines 110 of FIGS. 1-2. In some instances, the pattern may be formed using photolithography techniques. Following the patterning, the first etching operation may etch portions of the second electrode layer 225-c, the memory storage element layer 220-c, the first electrode layer 215-c and the word line 110-d layer that are between the patterned first set of rows 515. The first etching operation may remove material using a number of techniques, which may include, for example, chemical etching (also referred to as "wet etching"), plasma etching (also referred to as "dry etching"), or combinations thereof.

The first filling operation may include depositing a sealing layer 505 on the first set of rows 515, and depositing a dielectric material 510 between rows of the first set of rows 515. In some cases, the first filling operation may include a planarization operation, such as chemical mechanical planarization (CMP) to planarize the portion of the first memory deck.

The sealing layer 505 may include, for example, an insulating material such as silicon nitride, silicon oxide, or silicon oxynitride, which may be deposited using one or more of PECVD, CVD, ALD, or spin-on, just to name a few examples. The dielectric material 510 may include, for example, an insulating material such as silicon nitride, silicon oxide, or silicon oxynitride, which may be deposited using one or more of the deposition techniques as discussed above. In some cases, the sealing layer 505 may be deposited at a lower temperature to help prevent outgassing from chalcogenide glass that may be used in memory storage element layer 220-a, and the dielectric material 510 may be deposited at a higher temperature which may provide more consistent film uniformity.

Figure 6A:
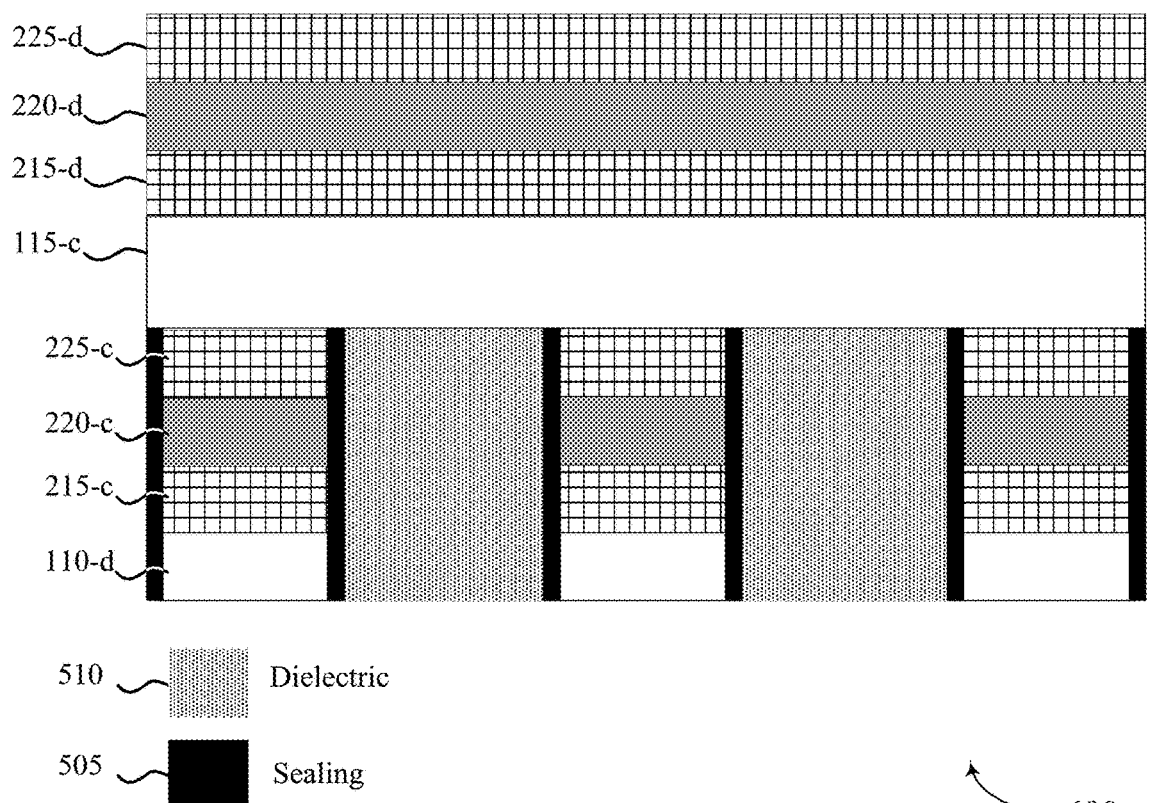
FIGS. 6A and 6B illustrate cross-sections of a portion of the first memory deck and a second memory deck during fabrication in accordance with examples of the present disclosure.
Figure 6B:
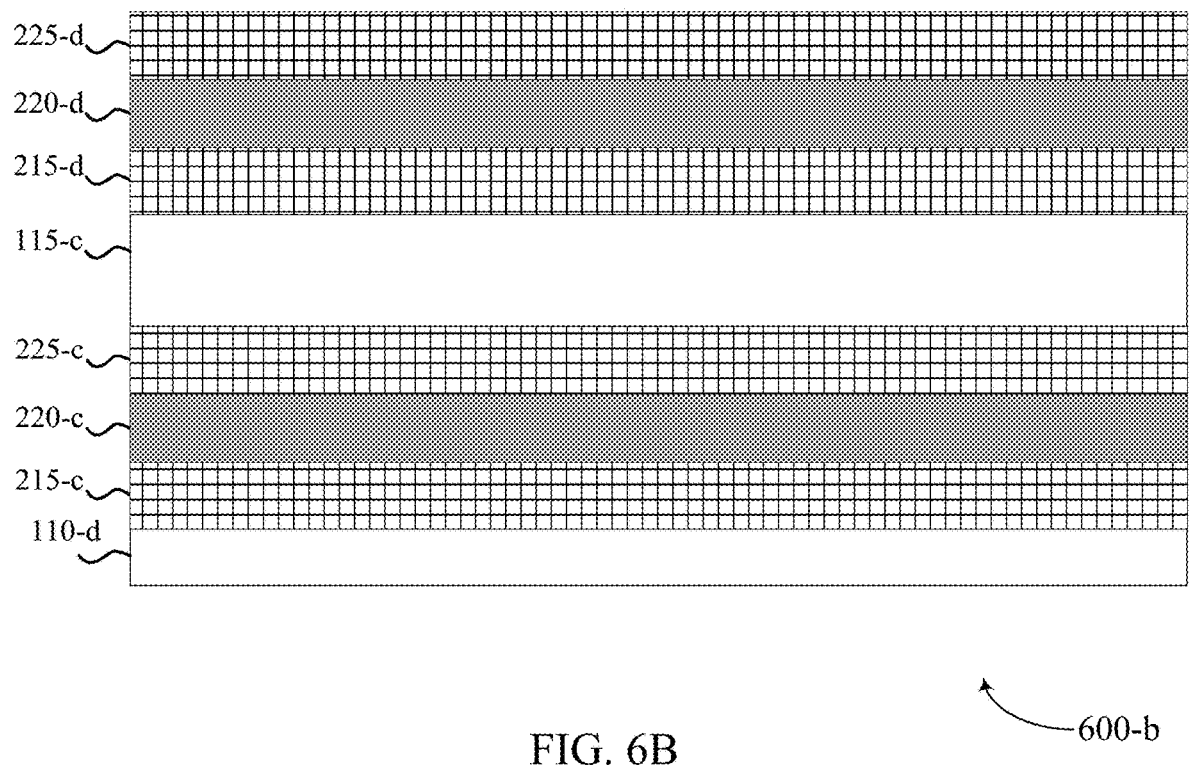

FIGS. 6A and 6B show a portion of a first memory deck and a second memory deck of a multi-layer cross point memory device 600 following deposition of a second electrode layer that may form a bit line 115-c layer, and first electrode layer 215-d, memory storage element layer 220-d, and second electrode layer 225-d of a second memory deck. FIG. 6A shows the cross-section in the X-direction and FIG. 6B shows the cross-section in the Y-direction, similarly as discussed above with respect to FIGS. 4-5.

In this embodiment, a blanket deposition may be used to form the second electrode metallization layer, which may be used to form the metallization for the bit line 115-c layer that may be shared between the first memory deck and the second memory deck. In some embodiments, the second electrode metallization layer may be deposited in a single deposition operation and thus not have an intra-layer boundary, and may be thicker than the first electrode metallization layer of the word line 110-d layer due to serving as an electrode for both the first memory deck and the second memory deck. In other embodiments, the second electrode metallization layer may be deposited in two or more separate deposition operations, or may include multiple different conductive materials. The bit line 115-c layer may be deposited according to any of the deposition techniques as discussed above, followed by formation of the first electrode layer 215-d, memory storage element layer 220-d, and second electrode layer 225-d of the second memory deck. These layers may, after processing, be examples of bit lines 115 and memory cells 105 of second memory deck 210 as described with reference to FIGS. 1 and 2. Memory storage element layer 220-d may, for example, be a variable resistance material, a chalcogenide, or a phase change material. Bit line 115-c layer may be a conductive layer and may include, in some examples, tungsten, aluminum, titanium, titanium nitride, silicon, polysilicon, or any combination thereof. Various techniques may be used to deposit the layers of the second memory deck, including any of the deposition techniques as discussed above.

Figure 7A:
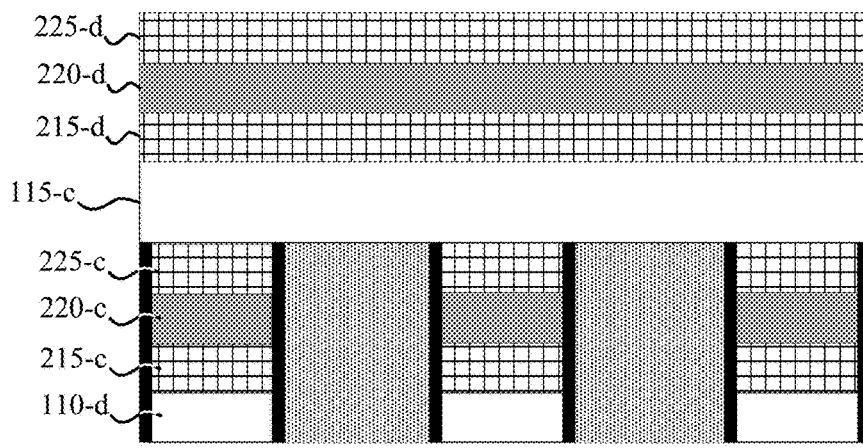
FIGS. 7A, 7B, and 7C illustrate cross-sections of a portion of the first memory deck and the second memory deck following first column processing during fabrication in accordance with examples of the present disclosure.
Figure 7B:
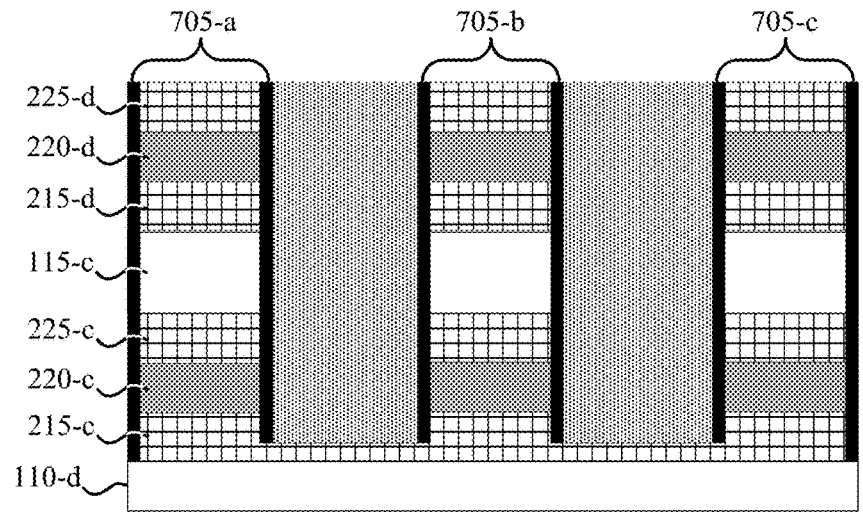
Figure 7C:
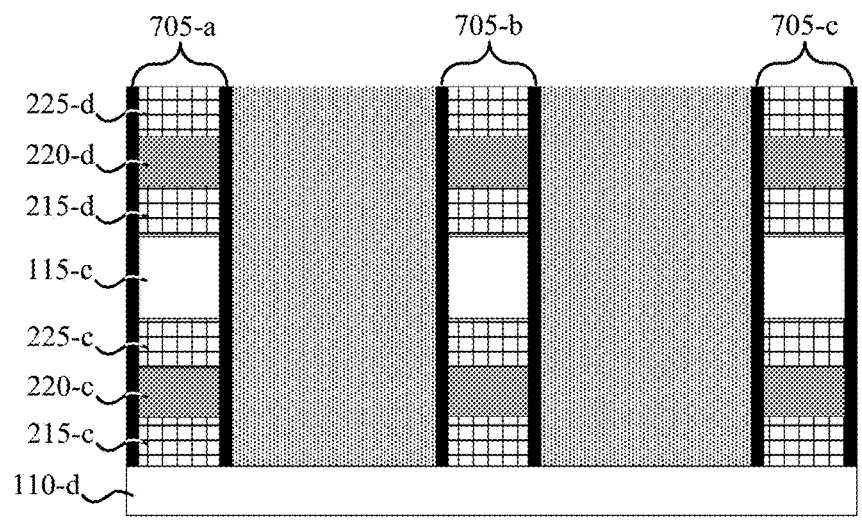

FIGS. 7A through 7C show a portion of a first memory deck and a second memory deck of a multi-layer cross point memory device 700 following a second patterning operation, a second etching operation, and a second filling operation in accordance with examples of the present disclosure. FIG. 7A shows the cross-section in the X-direction and FIGS. 7B and 7C show the cross-section in the Y-direction, similarly as discussed above with respect to FIGS. 4-6.

In this example, a first set of columns 705 may be patterned on the second electrode layer 225-d in the second patterning operation. The first set of columns 705 may be columns that are patterned to correspond to bit lines 115 of FIGS. 1-2. In some instances, the pattern may be formed using photolithography techniques. Following the patterning, the second etching operation may etch portions of both the second memory deck and the first memory deck. The etching operation may etch through the second memory deck to form the first set of columns 705, and etch through portions of the first set of rows 515 located between adjacent columns of the first set of columns 705 to form a first set of memory cells of the first memory deck. In some cases, the second etching operation may etch through the layers of the second memory deck, including the second electrode layer 225-d, the memory storage element layer 220-d, the first electrode layer 215-d of the second memory deck, etch through the bit line 115-c layer, and then etch through portions of the first memory deck that are located beneath and between the first set of columns 705, namely the second electrode layer 225-c, the memory storage element layer 220-c, the first electrode layer 215-c of the first memory deck.

The second etching operation may stop when it gets to the word line 110-d layer. In some embodiments, the etch may be stopped after etching the self-selecting memory material or after partial etch of the first electrode layer 215-c, and the first electrode layer 215-c would be in parallel, and act as a shunt, to the word line 110-d. In a similar fashion, the second electrode layer 225-c of the first deck could be deposited after the etch in word line, providing a parallel shunt to the bit line 115-c. The second etching operation may remove material using a number of techniques, such as discussed above. In some cases, a dry etching operation may be used that employs endpoint detection based on the chemical composition of the material being etched, and may stop etching when material of the word line 110-d layer is detected. In cases, where the word line 110-d layer and the bit line 115-c layer are formed of the same material (e.g., tungsten), the second etching process may continue etching through the first detection of the material (e.g., through the first detection of tungsten associated with the bit line 115-c layer) and stop upon a second detection of the material.

The second filling operation may include depositing a sealing layer 505 on the first set of columns 705, and depositing a dielectric material 510 between columns of the first set of columns 705. In some cases, the second filling operation may include a planarization operation, such as CMP to planarize the portion of the second memory deck. The sealing layer 505 and dielectric material 510 may be formed of the same materials as discussed above with respect to FIG. 5, and may be deposited using one or more of the deposition techniques as discussed above.

As can be observed in FIG. 7B, the columns 705 corresponding to bit lines 115 and the associated memory cells of both the first memory deck and the second memory deck are thus self-aligned in the direction of columns 705, as both memory decks and bit line 115-*c* layer are etched in a same etch operation. Additionally, a width of each column of the first set of columns 705 is a same width as a width of each respective memory element of the first memory deck located under each column 705, as the layers have a same patterning registration and are etched in a same etching operation. As can be observed in FIG. 7C in comparison to FIG. 7A, a width of each column 705 may be different than a width of each row of 110 in some cases.

Figure 8A:
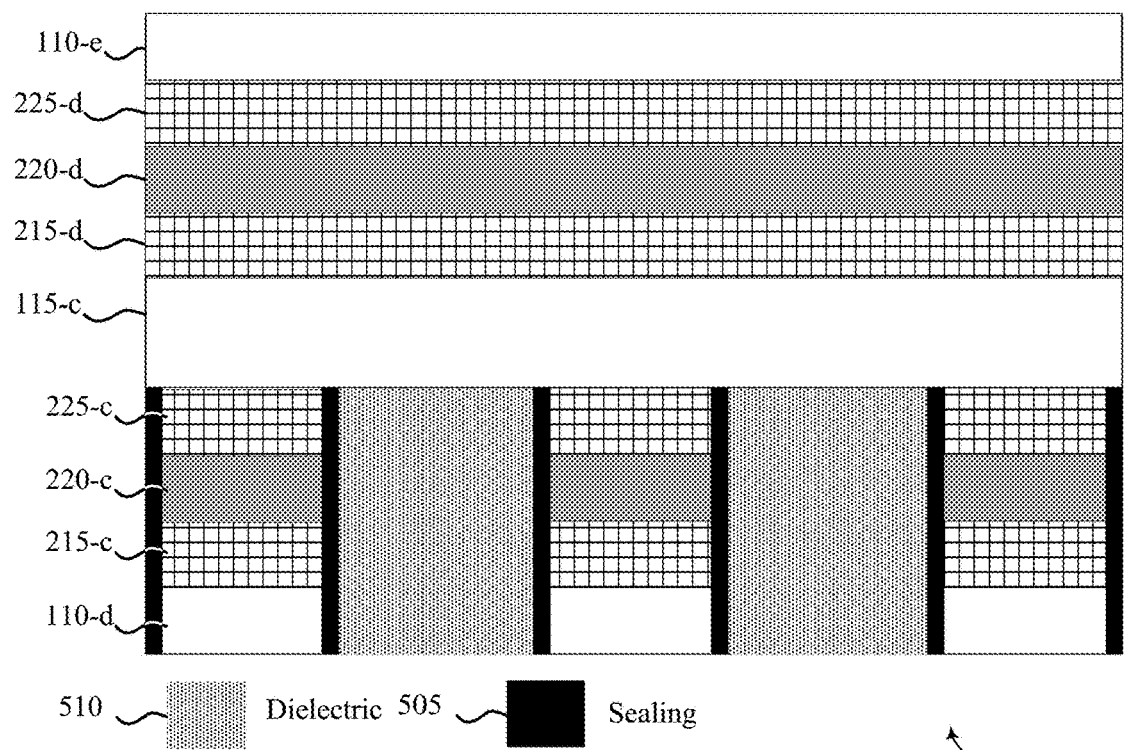
FIGS. 8A and 8B illustrate cross-sections of a portion of the first memory deck and the second memory deck following top electrode deposition during fabrication in accordance with examples of the present disclosure.
Figure 8B:
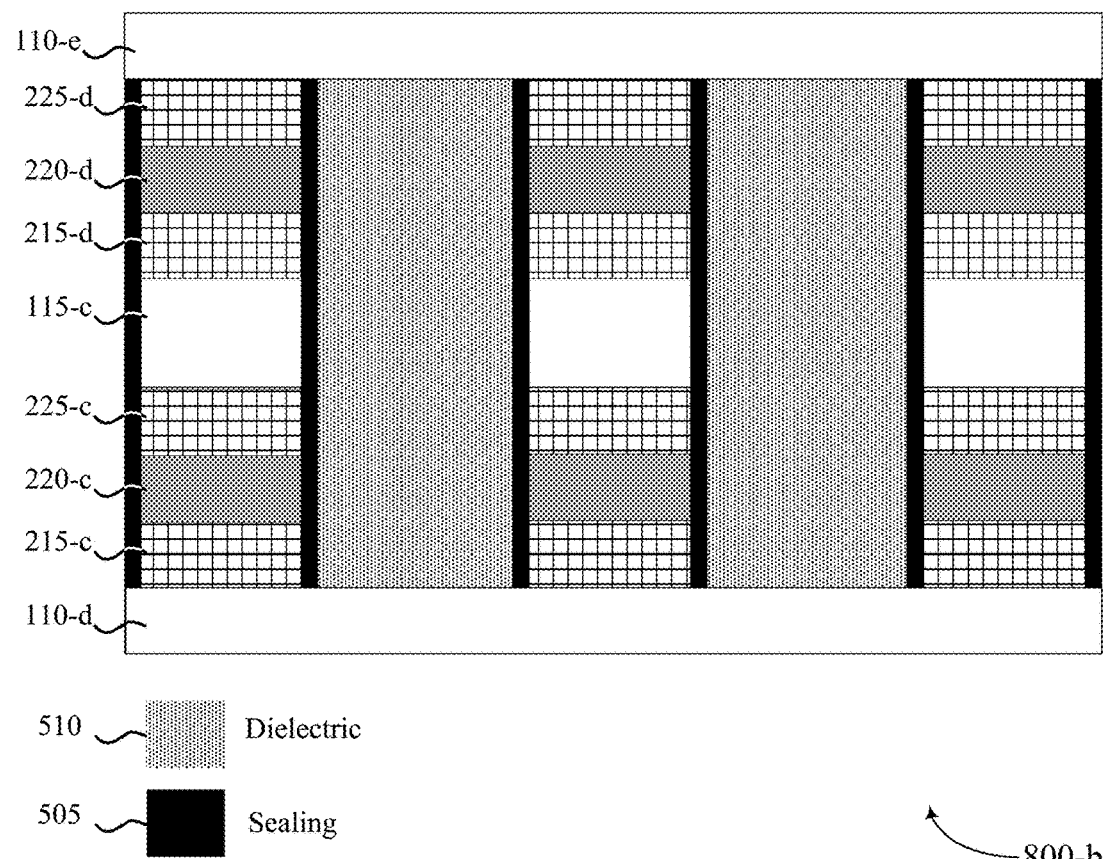

FIGS. 8A and 8B show a portion of a first memory deck and a second memory deck of a multi-layer cross point memory device 800 following deposition of a third electrode layer that may form a word line 110-*e* layer of the second memory deck. FIG. 8A shows the cross-section in the X-direction and FIG. 8B shows the cross-section in the Y-direction, similarly as discussed above with respect to FIGS. 4-7.

In this embodiment, a blanket deposition may be used to form the third electrode metallization layer, which may be used as the metallization for word line 110-*e* layer. The word line 110-*e* layer may be deposited according to any of the deposition techniques as discussed above. Word line 110-*e* layer may be a conductive layer and may include, in some examples, tungsten, aluminum, titanium, titanium nitride, silicon, polysilicon, or any combination thereof. Various techniques may be used to deposit the word line 110-*e* layer of the second memory deck, including any of the deposition techniques as discussed above.

Figure 9A:
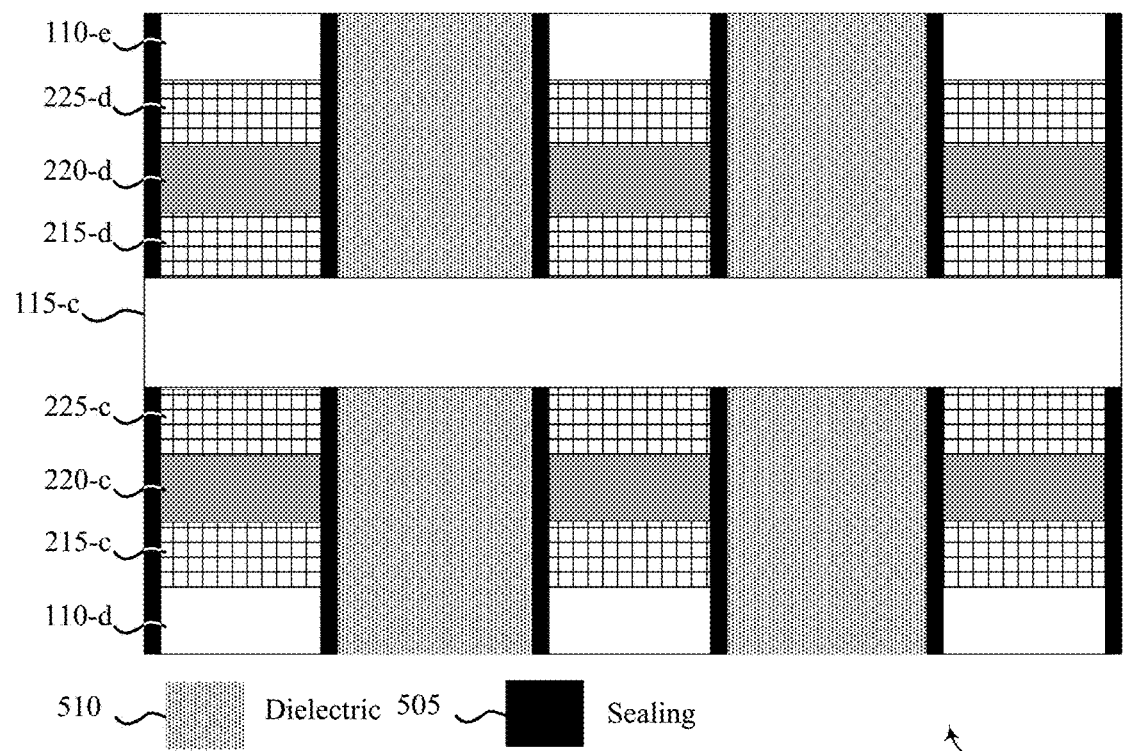
FIGS. 9A and 9B illustrate cross-sections of a portion of the first memory deck and the second memory deck following second row processing during fabrication in accordance with examples of the present disclosure.
Figure 9B:
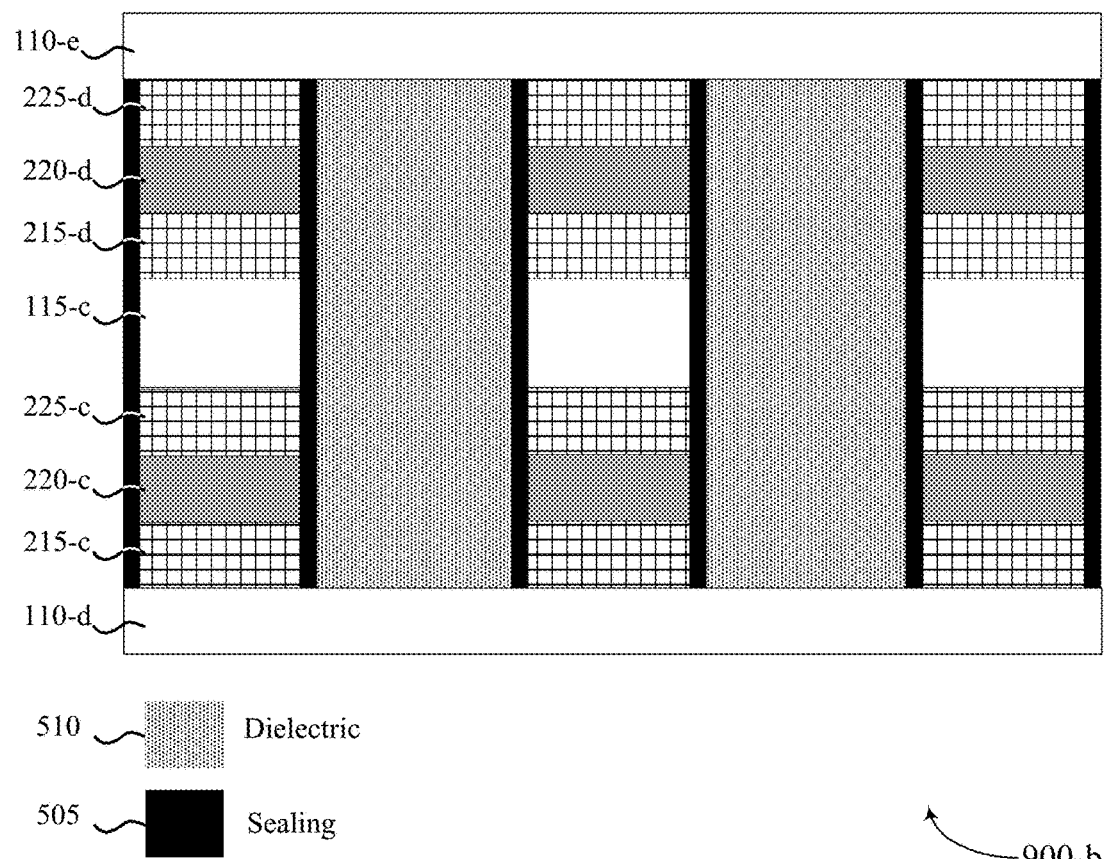

FIGS. 9A and 9B show a portion of a first memory deck and a second memory deck of a multi-layer cross point memory device 900 following a third patterning operation, a third etching operation, and a third filling operation in accordance with examples of the present disclosure. FIG. 9A shows the cross-section in the X-direction and FIG. 9B shows the cross-section in the Y-direction, similarly as discussed above with respect to FIGS. 4-8.

In this example, a second set of rows may be patterned on the word line 110-*e* layer in the third patterning operation. The second set of rows may be patterned to overlay the first set of rows 515. While the illustrations in the drawing figures show the second set of rows aligned with a same registration over the first set of rows 515, in practice there may be some amount of misalignment of the different sets of rows due to the patterning of the different sets or rows being performed in different patterning operations. In some embodiments, a width of the second set of rows may be different than the width of the first set of rows 515. The second set of rows may be rows that are patterned to correspond to word lines 110 of FIGS. 1-2.

Following the patterning, the third etching operation may etch portions of both the word line 110-*e* layer and the second memory deck. The etching operation may etch through the word line 110-*e* layer to form the second set of rows for bit lines 110-*e*, and etch through portions of the first set of columns 705 located between adjacent rows of the second set of rows to form a second set of memory cells of the second memory deck. The third etching operation may remove material using a number of techniques, such as discussed above. In some embodiments, similarly as discussed above, the third etching operation may be stopped after etching the self-selecting memory material or after partial etch of the second electrode layer 215-*d*, and the second electrode layer 215-*d* would be in parallel, and act as a shunt, to the bit line 115-*c*. In a similar fashion, the third electrode layer 225-*d* of the second deck could be deposited after the etch in word line, providing a parallel shunt to the word line 110-*e*. The third etching operation may stop when it gets to the bit line 115-*c* layer.

The third filling operation may include depositing a sealing layer 505 on the second set of rows, and depositing a dielectric material 510 between rows of the second set of rows. In some cases, the third filling operation may include a planarization operation, such as CMP, to planarize the portion of the second memory deck. The sealing layer 505 and dielectric material 510 may be formed of the same materials as discussed above with respect to FIGS. 5 and 7, and may be deposited using one or more of the deposition techniques as discussed above. As can be observed in FIG. 9A, the rows corresponding to top word lines 110-*e* and the associated memory cells of both the second memory deck are thus self-aligned in the direction of the top rows.

Thus, the portions of the memory device 900 illustrated in FIG. 9 show two memory decks of a cross-point memory device that are fabricated using three pattern and etching operations. In some cases, more than two memory decks may be fabricated in a memory device, and similar techniques may be used such that N decks of memory cells may be fabricated using N+1 patterning and etching operations. FIGS. 10-13 provide examples of other embodiments that have more than two memory decks.

Figure 10A:
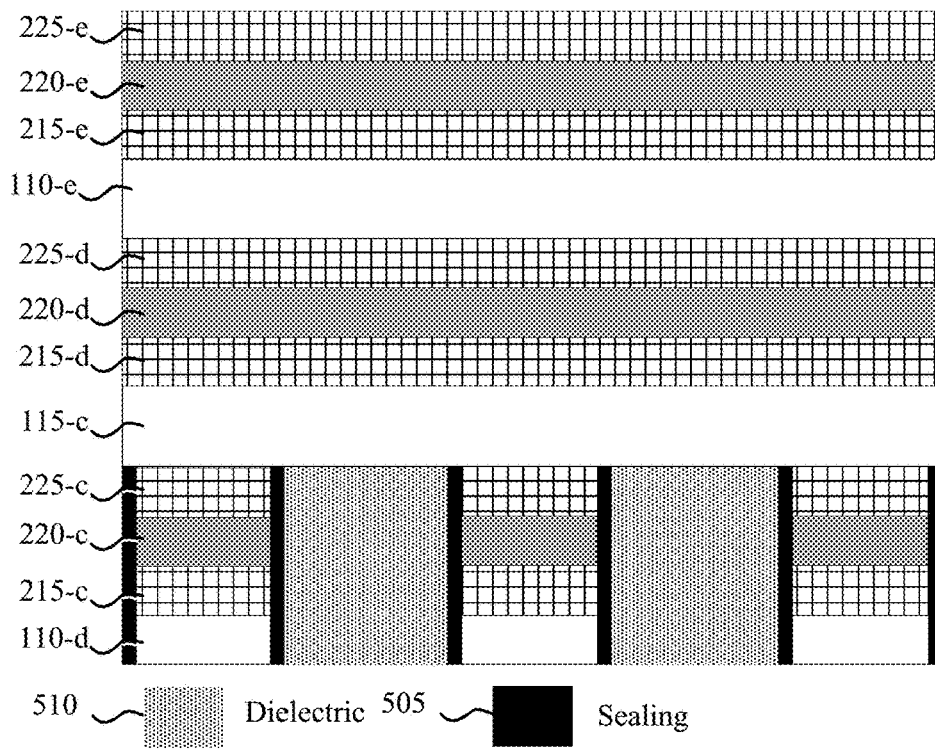
FIGS. 10A and 10B illustrate cross-sections of a portion of the first memory deck, the second memory deck, and a third memory deck during fabrication in accordance with examples of the present disclosure.
Figure 10B:
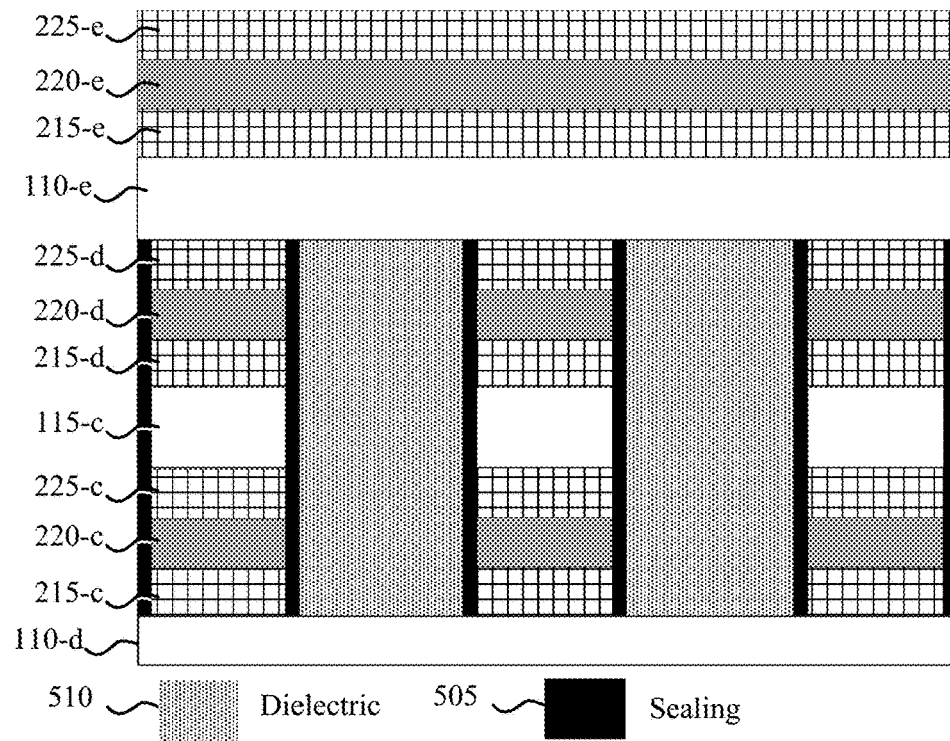

FIGS. 10A and 10B show a portion of a first memory deck, a second memory deck, and a third memory deck of a multi-layer cross point memory device 1000. In this example, the layers for the third memory deck may be deposited after the operations discussed above with respect to FIGS. 7A and 7B. The third memory deck may be formed from a third electrode layer that may form a word line 110-*e* layer, and first electrode layer 215-*e*, memory storage element layer 220-*e*, and second electrode layer 225-*e* of the third memory deck. FIG. 10A shows the cross-section in the X-direction and FIG. 10B shows the cross-section in the Y-direction, similarly as discussed above with respect to FIGS. 4-9.

In this embodiment, a blanket deposition may be used to form the third electrode metallization layer, which may be used to form the metallization for the word line 110-*e* layer that may be shared between the second memory deck and the third memory deck. In some embodiments, the third electrode metallization layer may be deposited in a single deposition operation, and may have a thickness that is similar to the thickness of the second electrode metallization layer of the bit line 115-*c* layer, and that is thicker than the first electrode metallization layer of the word line 110-*d* layer, due to serving as an electrode for both the second memory deck and the third memory deck. In other embodiments, the third electrode metallization layer may be deposited in two or more separate deposition operations, or may include multiple different conductive materials.

The word line 110-*e* layer may be deposited according to any of the deposition techniques as discussed above, followed by formation of the first electrode layer 215-*e*, memory storage element layer 220-*e*, and second electrode layer 225-*e* of the third memory deck. These layers may, after processing, be examples of word lines 110 and memory cells 105 of a third memory deck, as described with reference to FIGS. 1 and 2. Memory storage element layer 220-*e* may, for example, be a variable resistance material, a chalcogenide, or a phase change material. Word line 110-*e* layer may be a conductive layer and may include, in some examples, tungsten, aluminum, titanium, titanium nitride, silicon, polysilicon, or any combination thereof. Various techniques may be used to deposit the layers of the third memory deck, including any of the deposition techniques as discussed above.

Figure 11A:
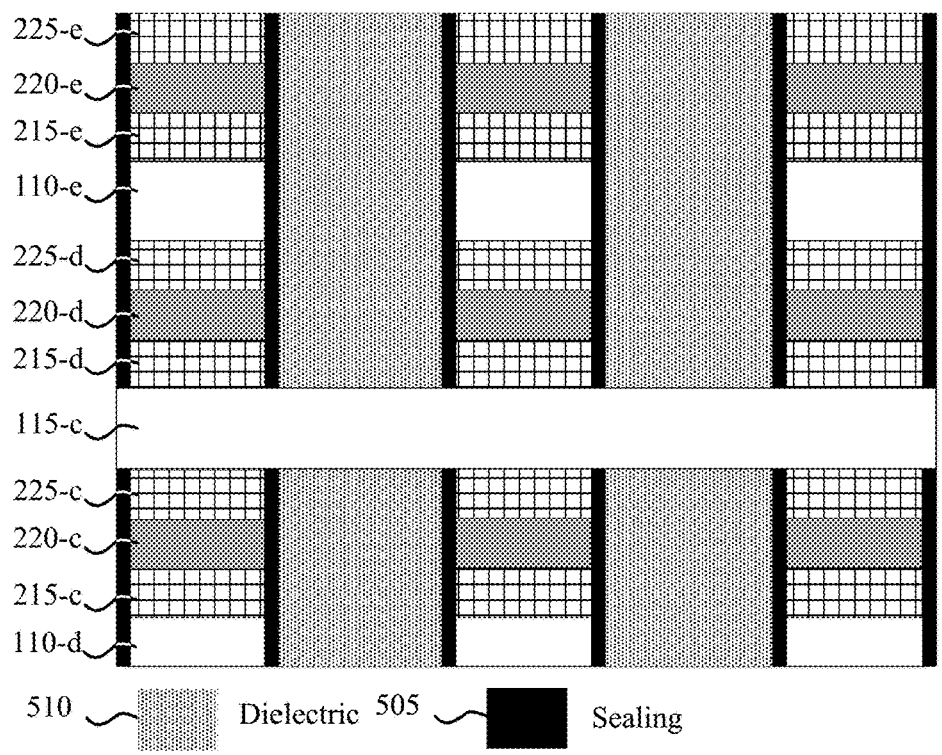
FIGS. 11A and 11B illustrate cross-sections of a portion of the first memory deck, the second memory deck, and the third memory deck following second row processing during fabrication in accordance with examples of the present disclosure.
Figure 11B:
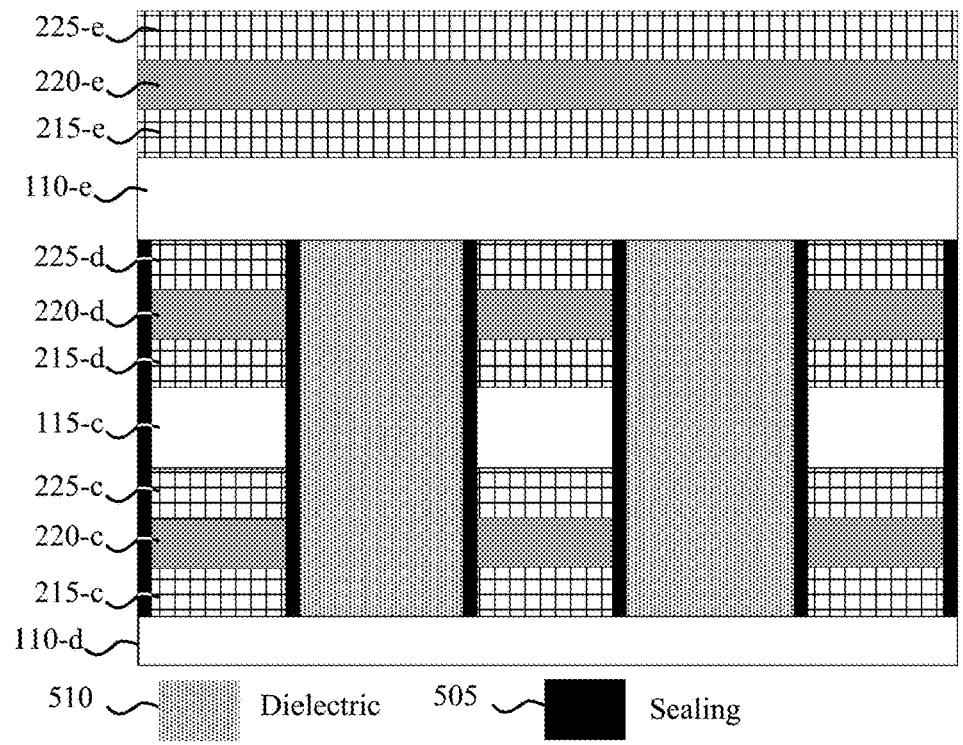

FIGS. 11A and 11B show a portion of a first memory deck, a second memory deck, and a third memory deck of a multi-layer cross point memory device 1100 following a third patterning operation, a third etching operation, and a third filling operation in accordance with examples of the present disclosure. FIG. 11A shows the cross-section in the X-direction and FIG. 11B shows the cross-section in the Y-direction, similarly as discussed above with respect to FIGS. 4-10.

In this example, a second set of rows may be patterned on the second electrode layer 225-e in the third patterning operation. The second set of rows may be rows that are patterned to correspond to word lines 110 of FIGS. 1-2. In some instances, the pattern may be formed using photolithography techniques. Following the patterning, the third etching operation may etch portions of both the third memory deck and the second memory deck. The etching operation may etch through the third memory deck to form the second set of rows, and etch through portions of the first set of columns 705 located between adjacent rows of the second set of rows to form a second set of memory cells of the second memory deck. In some cases, the third etching operation may etch through the layers of the third memory deck, including the second electrode layer 225-e, the memory storage element layer 220-e, the first electrode layer 215-e of the third memory deck, etch through the word line 110-e layer, and then etch through portions of the second memory deck that are located beneath and between the second set of rows, namely the second electrode layer 225-d, the memory storage element layer 220-d, the first electrode layer 215-d of the second memory deck.

The third etching operation may stop when it gets to the bit line 115-c layer. The third etching operation may remove material using a number of techniques, such as discussed above. In some cases, the etching operation may use endpoint detection to identify that the bit line 115-c layer has been reached, as discussed above. The third filling operation may include depositing a sealing layer 505 on the second set of rows, and depositing a dielectric material 510 between rows of the second set of rows. In some cases, the third filling operation may include a planarization operation, such as CMP, to planarize the portion of the third memory deck. The sealing layer 505 and dielectric material 510 may be formed of the same materials as discussed above with respect to FIG. 5, and may be deposited using one or more of the deposition techniques as discussed above.

As can be observed in FIG. 11B, the rows corresponding to word lines 110 and the associated memory cells of both the second memory deck and the third memory deck are thus self-aligned in the direction of the rows, as both memory decks and word line 110-e layer are etched in a same etch operation. Additionally, a width of each row of the second set of rows is a same width as a width of each respective memory element of the second memory deck located under each row of the second set of rows, as the layers have a same patterning registration and are etched in a same etching operation.

Figure 12A:
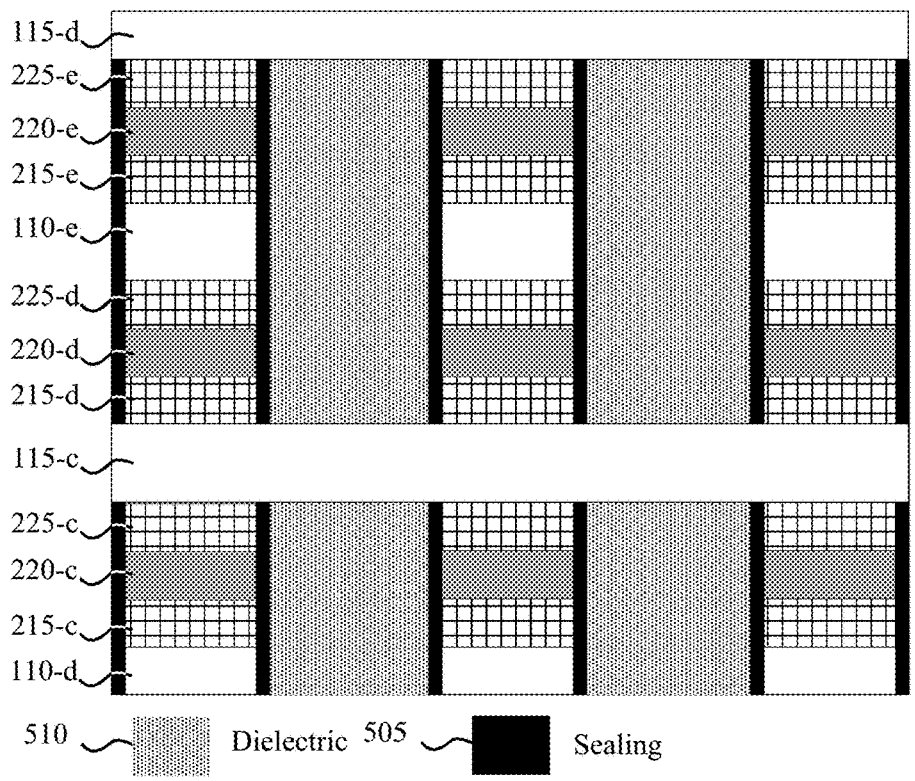
FIGS. 12A and 12B illustrate cross-sections of a portion of the first memory deck, the second memory deck, and the third memory deck following top electrode deposition and second column processing during fabrication in accordance with examples of the present disclosure.
Figure 12B:
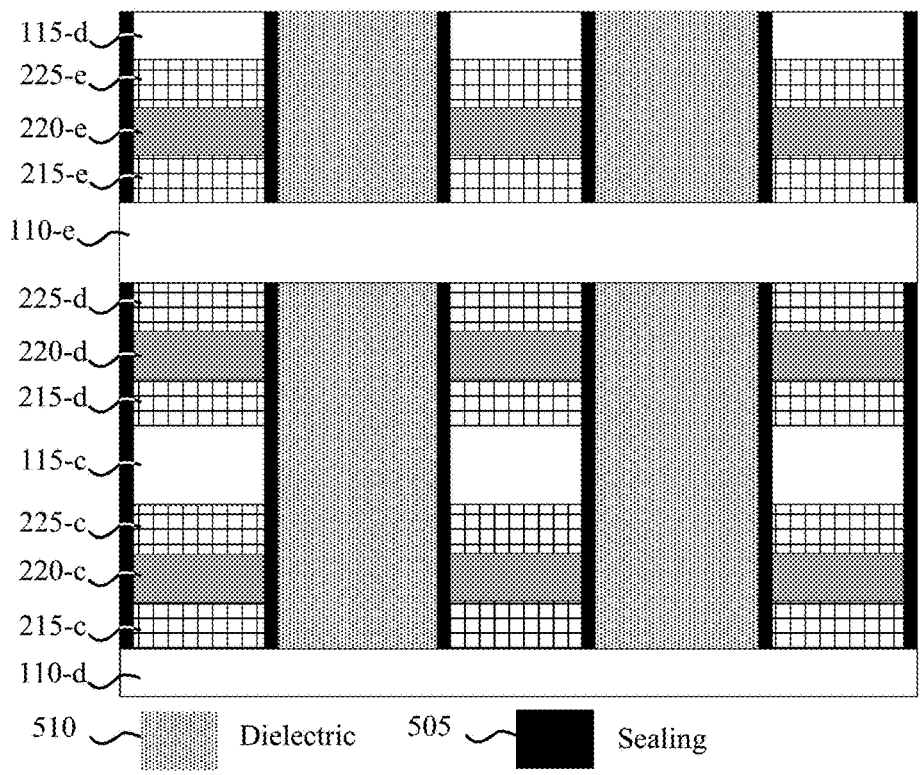

FIGS. 12A and 12B show a portion of a first memory deck, a second memory deck, and a third memory deck of a multi-layer cross point memory device 1200 following deposition of a fourth electrode layer and a fourth patterning and etching operation, that may form a bit line 115-d layer and complete formation of memory cells of the third memory deck. FIG. 12A shows the cross-section in the X-direction and FIG. 12B shows the cross-section in the Y-direction, similarly as discussed above with respect to FIGS. 4-11.

In this embodiment, a blanket deposition may be used to form the fourth electrode metallization layer, which may be used as the metallization for bit line 115-d layer. The bit line 115-d layer may be deposited according to any of the deposition techniques as discussed above. Bit line 115-d layer may be a conductive layer and may include, in some examples, tungsten, aluminum, titanium, titanium nitride, silicon, polysilicon, or any combination thereof. Various techniques may be used to deposit the bit line 115-d layer of the third memory deck, including any of the deposition techniques as discussed above.

In this example, a second set of columns may be patterned on the bit line 115-d layer in the fourth patterning operation. The second set of columns may be patterned to overlay the first set of columns 705. While the illustrations in the drawing figures show the second set of columns aligned with a same registration over the first set of columns 705, in practice there may be some amount of misalignment of the different sets of columns due to the patterning of the different sets of columns being performed in different patterning operations. In some embodiments, a width of the second set of columns may be different than the width of the first set of columns 705. The second set of columns may be columns that are patterned to correspond to bit lines 115 of FIGS. 1-2.

Following the patterning, the fourth etching operation may etch portions of both the bit line 115-d layer and the third memory deck. The etching operation may etch through the bit line 115-d layer to form the second set of columns for bit lines 115-d, and etch through portions of the second set of rows located between adjacent columns of the second set of columns to form a third set of memory cells of the third memory deck. The fourth etching operation may stop when it gets to the word line 110-e layer. The fourth etching operation may remove material using a number of techniques, such as discussed above.

The fourth filling operation may include depositing a sealing layer 505 on the second set of columns, and depositing a dielectric material 510 between columns of the second set of columns. In some cases, the fourth filling operation may include a planarization operation, such as CMP, to planarize the portion of the third memory deck. The sealing layer 505 and dielectric material 510 may be formed of the same materials as discussed above with respect to FIGS. 5 and 11, and may be deposited using one or more of the deposition techniques as discussed above. As can be observed in FIG. 12A, the columns corresponding to top bit lines 115-d and the associated memory cells of the third memory deck are thus self-aligned in the direction of the top columns.

Figure 13A:
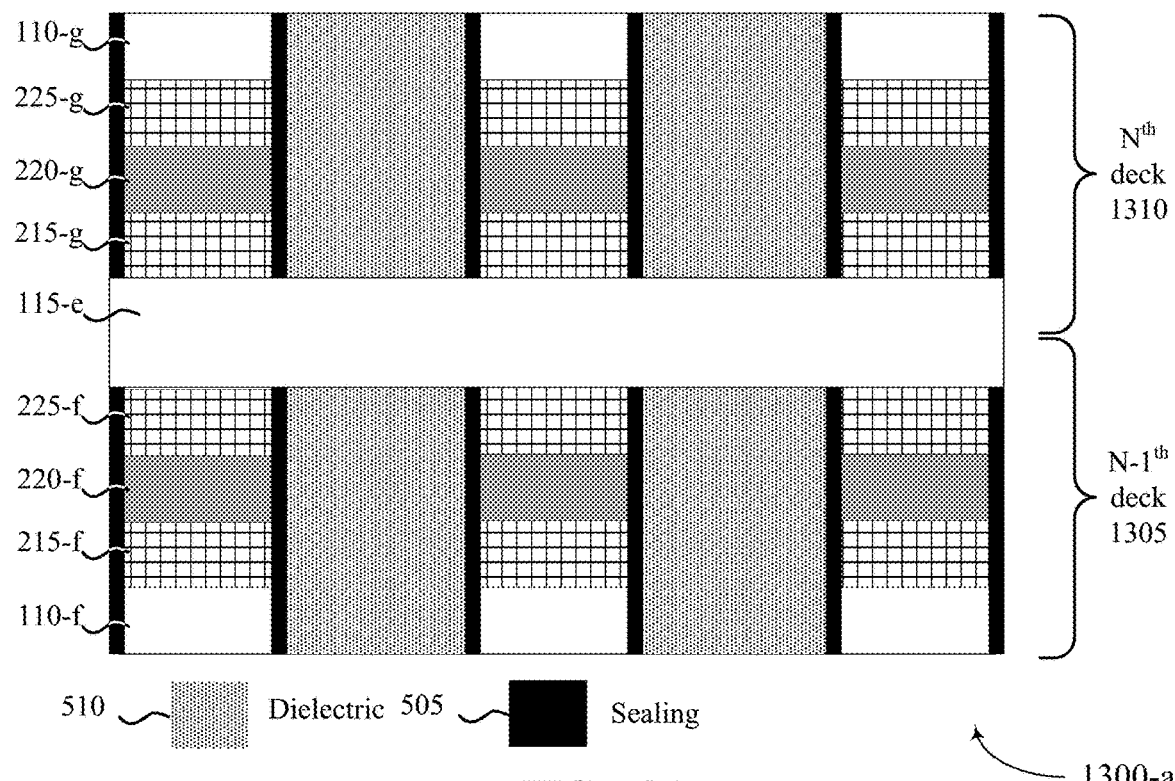
FIGS. 13A and 13B illustrate cross-sections of a portion of self-aligned memory decks during fabrication in accordance with examples of the present disclosure.
Figure 13B:
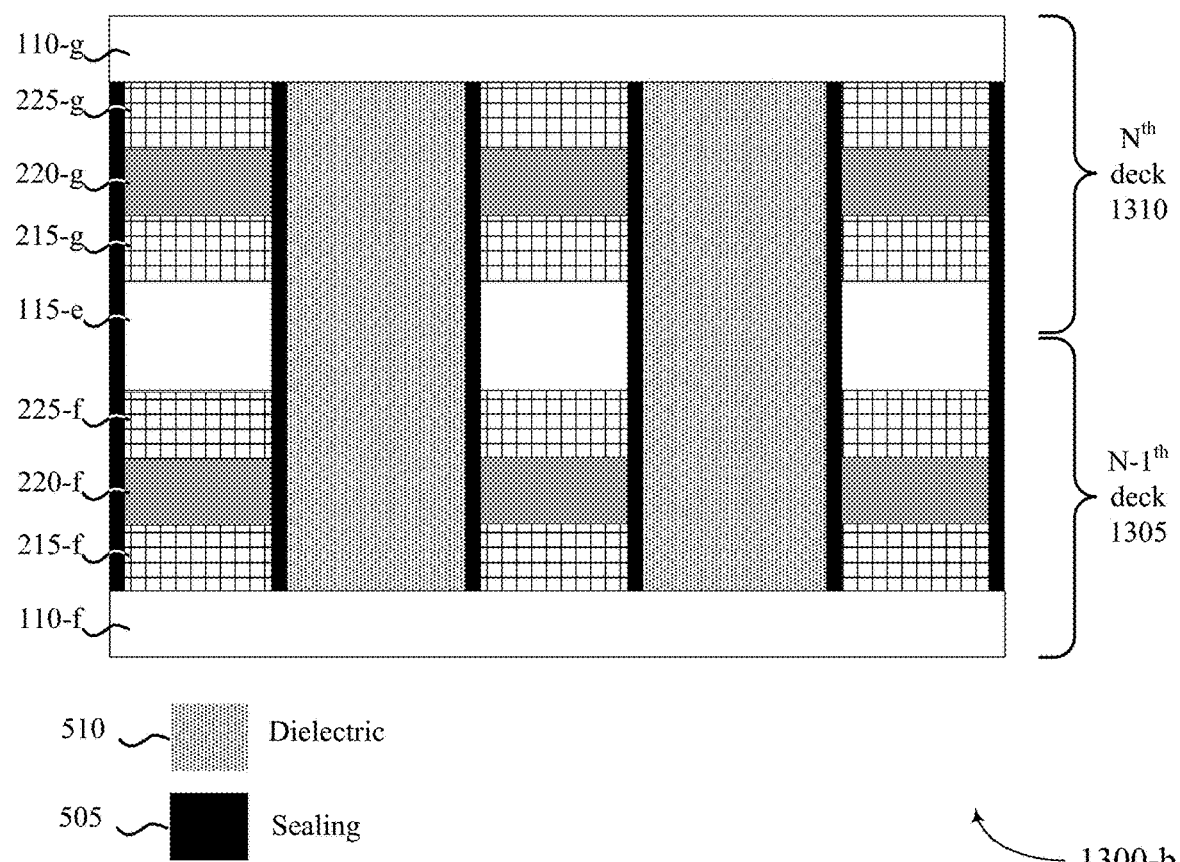

Thus, the portions of the memory device 1200 illustrated in FIG. 12 show three memory decks of a cross-point memory device that are fabricated using four pattern and etching operations. FIGS. 13A and 13B show a portion of an N−1$^{th}$ deck 1305 and an N$^{th}$ deck of a multi-layer cross point memory device 1300. FIG. 13A shows the cross-section in the X-direction and FIG. 13B shows the cross-section in the Y-direction, similarly as discussed above with respect to FIGS. 4-12. The additional decks of a memory device may be fabricated according to the deposition, patterning, and etching sequences as discussed above, in which subsequently deposited memory decks share patterning and etching operations with a lower memory deck in one direction to be self-aligned with the lower memory deck in that direction, to provide that N decks of memory cells may be fabricated using N+1 patterning and etching operations. As mentioned above, in some embodiments, different pitches may be used for bitline and wordline directions, which may provide a horizontal cross section of the self-selecting memory material that is square, rectangular, or another shape, depending upon the masking and etching techniques used.

Figure 14:
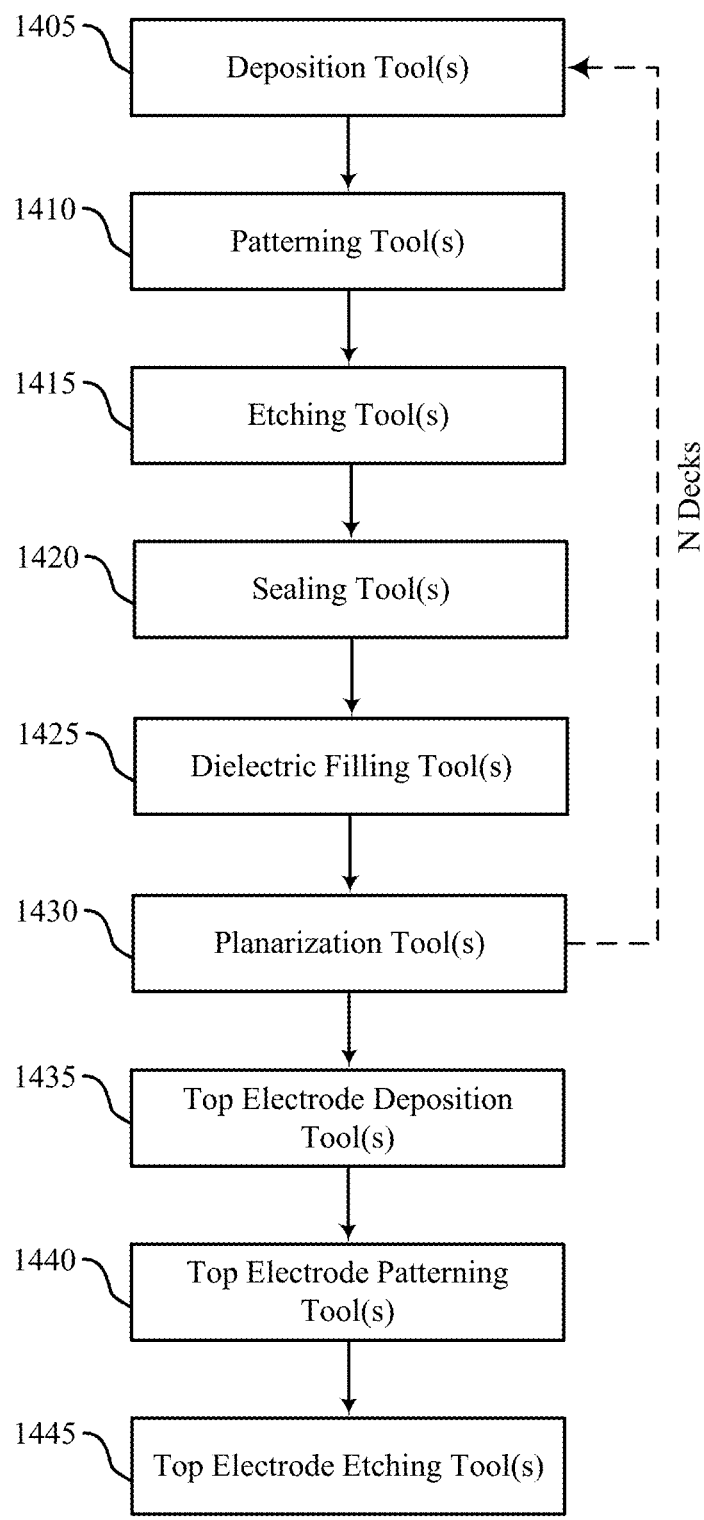
FIGS. 14 through 17 illustrate a method or methods for fabricating a self-aligned memory decks in cross-point memory arrays in accordance with aspects of the present disclosure.

FIG. 14 is a flow diagram of a fabrication process 1400, according to various embodiments. Initially, a substrate may be processed at one or more deposition tool(s) 1405 to form the layers for a first memory deck. In some cases, as discussed above, the substrate may be a semiconductor substrate (e.g., a silicon wafer), which may have control circuitry fabricated such that memory decks are formed on top of the control circuitry. In some cases, the deposition tool(s) may include a metallization deposition tool that deposits a first electrode layer, an electrode layer deposition tool that deposits a first electrode layer, a memory element deposition tool that deposits a memory element layer, and the electrode layer deposition tool that deposits a second electrode layer. In some examples, the deposition tool(s) may deposit layers for a memory deck such as illustrated in FIGS. 4A and 4B. The deposition tools may include one or more of a CVD tool, a MOCVD tool, a PECVD tool, PVD tool, a sputter deposition tool, an ALD, a MBE tool, a spin-on tool, or other thin film deposition tool.

Following deposition of the layers for the memory deck, one or more patterning tool(s) 1410 may deposit and pattern an etch mask into set of etch mask lines, which may include etch masked rows or etch masked columns depending upon the memory deck that is to be etched. Such an etch mask may comprise a photoresist, a dielectric, or other material that is relatively easy to etch into a line pattern, for example. Patterning may be performed using photolithography (e.g., direct print, expose/shift/expose, expose/positive develop/negative develop), photolithography with pitch doubling process (e.g., spacers), and imprinting, just to name a few examples.

Continuing with process 1400, one or more etching tool(s) 1415 may etch the layers of the memory deck. In some embodiments, a plasma etch process may be used at etching tool(s) 1415. In other embodiments, a wet etch may be used, either alone or in combination with one or more plasms or dry etches. The etch mask may be removed, in some examples, (e.g., via a wet photoresist removal process). In other examples, the etch mask may remain on the top of the memory deck layers and used as a sacrificial layer in a subsequent planarization process. Once the etching is completed, sealing tool(s) 1420 may deposit a sealing layer on the rows of columns of the memory deck layers. The sealing tool(s) 1420 may include processing equipment that may deposit a dielectric material (e.g., $SiO_2$) using a CVD or PECVD process, or any other thin film deposition process. Dielectric filling tool(s) 1425 may deposit dielectric filling material on the sealed rows or columns. Dielectric filling tool(s) 1425 may include processing equipment that may deposit a dielectric material (e.g., $SiO_2$) using a CVD or PECVD process, or any other thin film deposition process. In some cases, deposition of the sealing layer may be done at a lower temperature than deposition of the dielectric filling material, to help reduce outgassing of the memory element layer material (e.g., to reduce chalcogenide glass outgassing) that may occur at relatively high rates if processing at higher temperatures associated with the filling material deposition were to be used in an absence of a sealing layer.

Planarization tool(s) 1430 may then planarize the memory deck, and remove excess sealing material or dielectric filling material. Planarization tool(s) 1430 may include, for example, CMP processing equipment that may planarize the memory deck, thus leaving rows or columns of memory deck layers, such as illustrated in FIGS. 5A and 5B. The processing at tools 1405 through 1430 may be repeated for a number of memory decks that may be fabricated for a memory device, with an upper memory deck and a lower memory deck sharing the patterning, etching, sealing/filling, and planarization processes for one masking direction (e.g., a row pattern or a column pattern). For example, if a memory device has two memory decks, the processing at tools 1405 through 1430 may be repeated twice, in which a first pass through etching tool(s) 1415 may provide etching for rows of a first memory deck, and a second pass through etching tool(s) 1415 provide etching for columns of both the first memory deck and a second memory deck, such as illustrated in the example of FIGS. 7A and 7B.

Following planarization of the top memory deck, top electrode deposition tool(s) 1435 may deposit a top electrode (e.g., a word line 110 or bit line 115 electrode layer). The top electrode deposition tool(s) 1435 may include some of the same deposition tools 1405 that are used as part of electrode deposition of another electrode layer of another memory deck. Top electrode patterning tool(s) 1440 may pattern the top electrode layer according to whether the top electrode is a word line or a bit line, for example. The top electrode patterning tool(s) 1440 may include some of the same patterning tools 1410 that are used for patterning self-selecting memory stacks of the two or more memory decks. Top electrode etching tool(s) 1445 may etch the top electrode and portions of the top memory deck self-selecting memory stack. The top electrode etching tool(s) 1445 may include some of the same etching tools 1415 that are used for patterning self-selecting memory stacks of the two or more memory decks. Top electrode layer and portions of the top memory deck etched with the top electrode layer may be sealed, dielectric filled, and planarized in some embodiments.

Thus, N decks of memory cells may be formed with N+1 patterning, etching, and dielectric sealing/filling processes, and portions of memory decks that are etched in the same etching processes are also self-aligned. Compared to processing in which both rows and columns of a memory deck are separately processed for each memory deck, which would require 2N patterning, etching, and sealing/filling processes, such a reduction may provide substantial manufacturing efficiencies. For example, fabricating memory devices with two memory decks may use 3 patterning, etching, and sealing/filling operations compared to 4 such operations if separate processing per memory deck were used, resulting in a 25% reduction in such processing operations. In cases where a patterning, etching, or sealing/filling (or associated planarization) operation is a bottleneck in a fabrication facility, such a reduction in processing steps can increase a production capability of a fabrication facility by a similar percentage (e.g., a fab with a 5000 wafer starts per week (WSPW) capacity may be potentially increased to 6250 WSPW). In any case, such a reduction in processing steps reduces cost and cycle time of memory device fabrication, which provides for more efficient fabrication and likely fewer defects to thereby also enhance yield.

Figure 15:
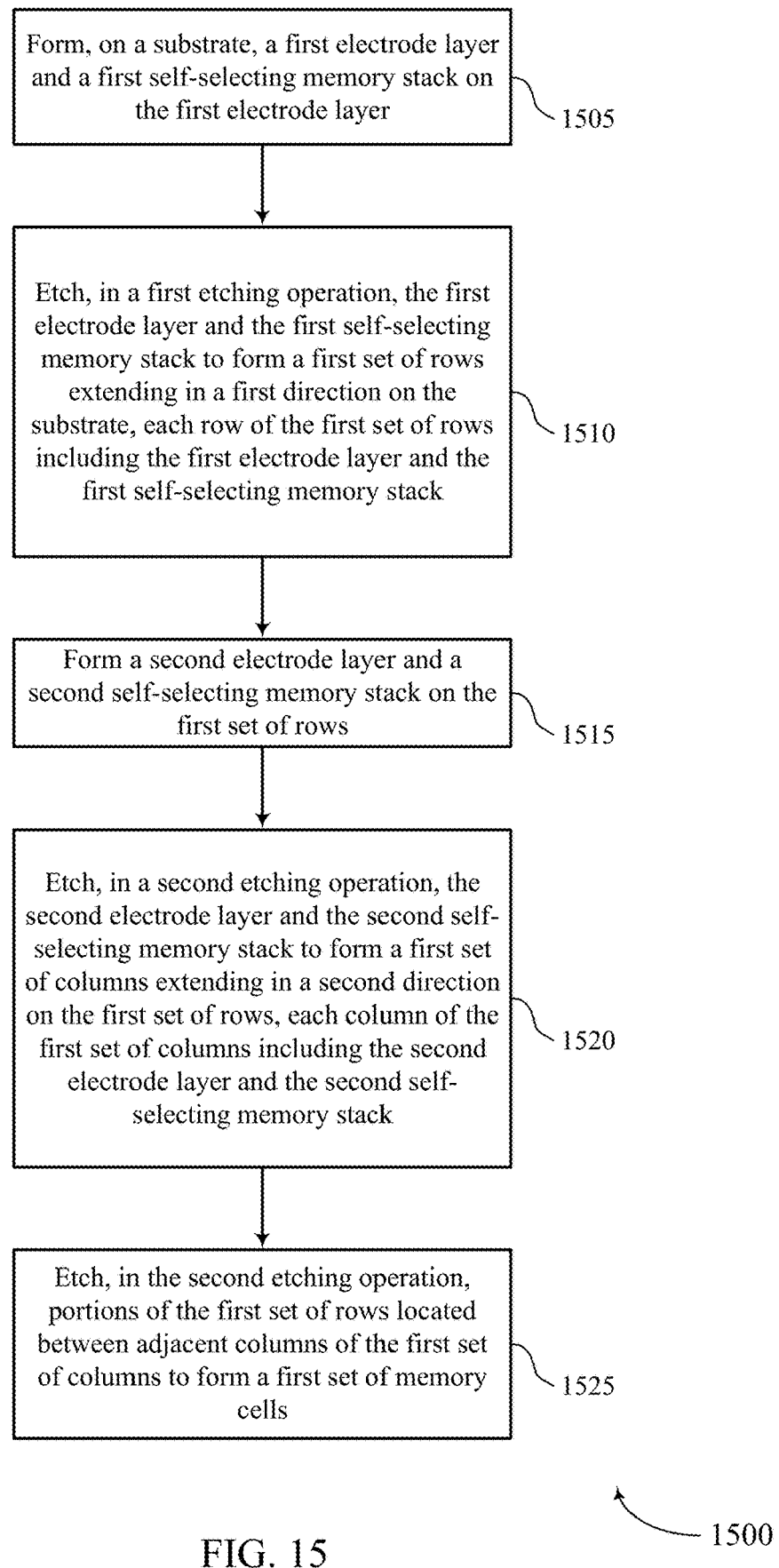

FIG. 15 shows a flowchart illustrating a method 1500 for forming self-aligned memory decks in cross-point memory arrays in accordance with various aspects of the present disclosure. The operations of method 1500 may be performed by processing tools described with reference to FIG. 14.

At block 1505 one or more deposition tools may form, on a substrate, a first electrode layer and a first self-selecting memory stack on the first electrode layer. The operations of block 1505 may be performed according to the methods described with reference to FIGS. 4 through 13. In certain examples, aspects of the operations of block 1505 may be performed by deposition tools as described with reference to FIG. 14.

At block 1510 one or more etching tools may etch, in a first etching operation, the first electrode layer and the first self-selecting memory stack to form a first set of rows extending in a first direction on the substrate, each row of the first set of rows comprising the first electrode layer and the first self-selecting memory stack. The operations of block 1510 may be performed according to the methods described with reference to FIGS. 4 through 13. In certain examples, aspects of the operations of block 1510 may be performed by etching tools as described with reference to FIG. 14. In some cases, dielectric sealing and/or filling material may be deposited between each row of the first set of rows, and in some cases also may be planarized.

At block 1515 the one or more deposition tools may form a second electrode layer and a second self-selecting memory stack on the first set of rows. The operations of block 1515 may be performed according to the methods described with reference to FIGS. 4 through 13. In certain examples, aspects of the operations of block 1515 may be performed by deposition tools as described with reference to FIG. 14.

At block 1520 the one or more etching tools may etch, in a second etching operation, the second electrode layer and the second self-selecting memory stack to form a first set of columns extending in a second direction on the first set of rows, each column of the first set of columns comprising the second electrode layer and the second self-selecting memory stack. The operations of block 1520 may be performed according to the methods described with reference to FIGS. 4 through 13. In certain examples, aspects of the operations of block 1520 may be performed by etching tools as described with reference to FIG. 14.

At block 1525 the one or more etching tools also may etch, in the second etching operation, portions of the first set of rows located between adjacent columns of the first set of columns to form a first set of memory cells. The operations of block 1525 may be performed according to the methods described with reference to FIGS. 4 through 13. In certain examples, aspects of the operations of block 1525 may be performed by etching tools as described with reference to FIG. 14. In some cases, the second etching operation comprises: etching through the second self-selecting memory stack, through the second electrode layer, and through portions of the first self-selecting memory stack below and between adjacent columns the first set of columns.

In some cases, the second electrode is formed in a single deposition process and is etched in a single etching process as part of the second etching process. In some cases, each self-selecting memory stack comprises a first layer of carbon, a layer of chalcogenide glass on the first layer of carbon, and a second layer of carbon on the layer of chalcogenide glass. In some cases, a width of each column of the first set of columns is a same width as a width of each respective memory element located under each column of the first set of columns. In some cases, the second electrode layer forms an upper access line for a column of memory cells of the first set of memory cells that are located under each column of the first set of columns, and forms a lower access line for a second column of a second set of memory cells formed using the second self-selecting memory stack.

Figure 16:
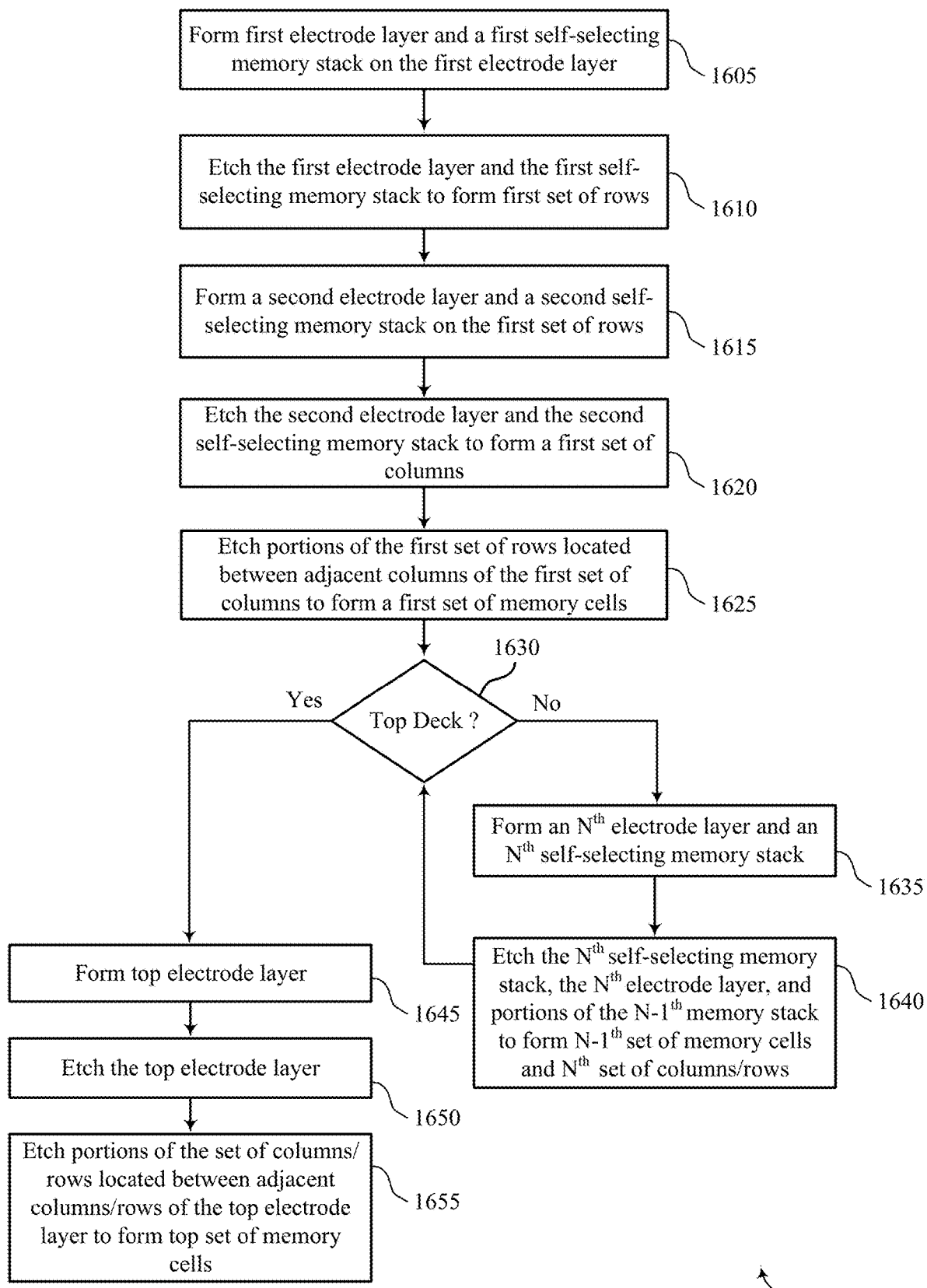
Figure 17:
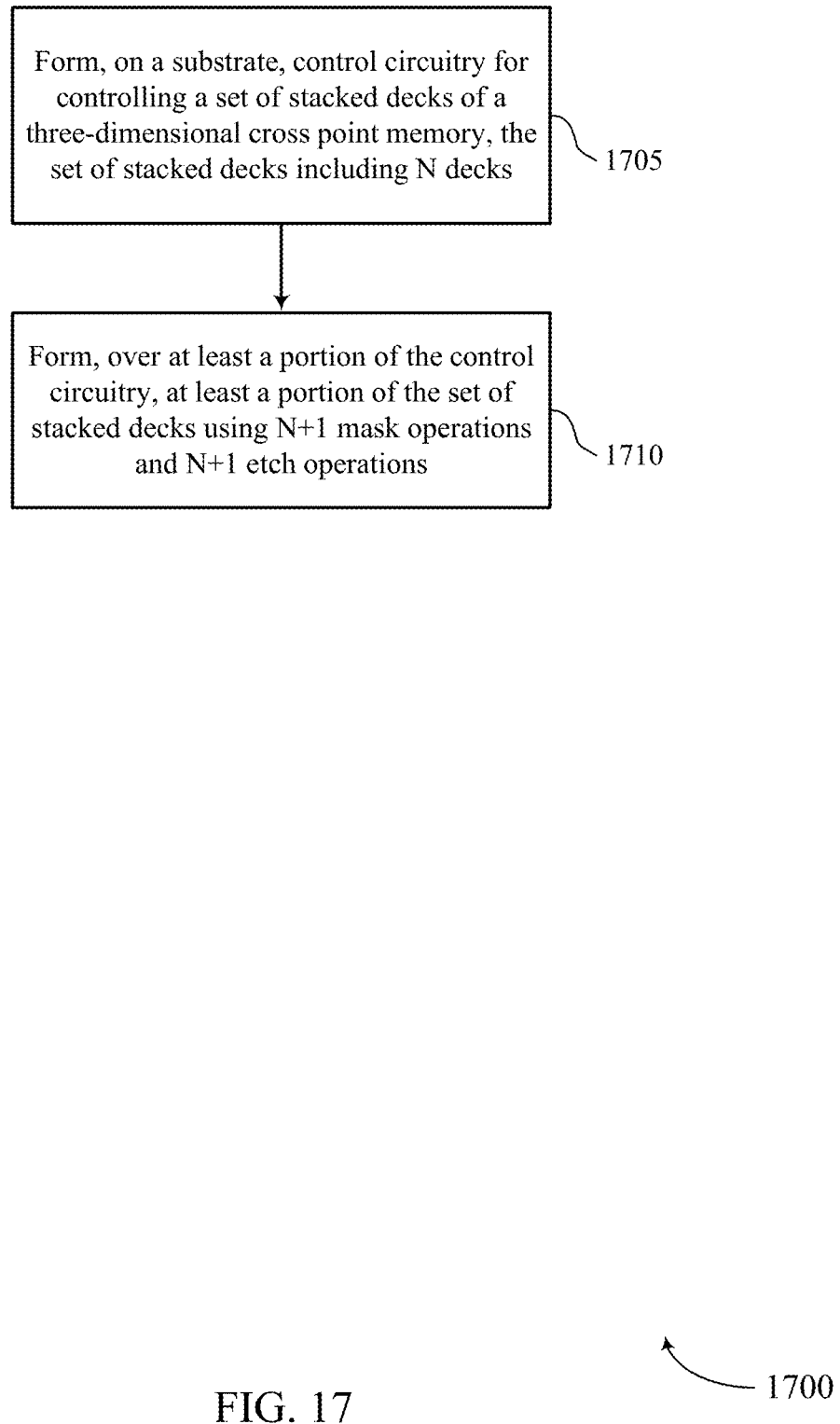

FIG. 16 shows a flowchart illustrating a method 1600 for forming self-aligned memory decks in cross-point memory arrays in accordance with various aspects of the present disclosure. The operations of method 1600 may be performed by processing tools described with reference to FIG. 14.

At block 1605 the processing tools may form, on a substrate, a first electrode layer and a first self-selecting memory stack on the first electrode layer. The operations of block 1605 may be performed according to the methods described with reference to FIGS. 4 through 13. In certain examples, aspects of the operations of block 1605 may be performed by deposition tools as described with reference to FIG. 14.

At block 1610 the processing tools may etch, in a first etching operation, the first electrode layer and the first self-selecting memory stack to form a first set of rows extending in a first direction on the substrate, each row of the first set of rows comprising the first electrode layer and the first self-selecting memory stack. The operations of block 1610 may be performed according to the methods described with reference to FIGS. 4 through 13. In certain examples, aspects of the operations of block 1610 may be performed by etching tools as described with reference to FIG. 14. In some cases, one or more etching operations of FIG. 16 may also include dielectric sealing and filling, and planarization operations.

At block 1615 the processing tools may form a second electrode layer and a second self-selecting memory stack on the first set of rows. The operations of block 1615 may be performed according to the methods described with reference to FIGS. 4 through 13. In certain examples, aspects of the operations of block 1615 may be performed by deposition tools as described with reference to FIG. 14.

At block 1620 the processing tools may etch, in a second etching operation, the second electrode layer and the second self-selecting memory stack to form a first set of columns extending in a second direction on the first set of rows, each column of the first set of columns comprising the second electrode layer and the second self-selecting memory stack. The operations of block 1620 may be performed according to the methods described with reference to FIGS. 4 through 13. In certain examples, aspects of the operations of block 1620 may be performed by etching tools as described with reference to FIG. 14.

At block 1625 the processing tools may etch, in the second etching operation, portions of the first set of rows located between adjacent columns of the first set of columns to form a first set of memory cells. The operations of block 1625 may be performed according to the methods described with reference to FIGS. 4 through 13. In certain examples, aspects of the operations of block 1625 may be performed by etching tools as described with reference to FIG. 14.

At block 1630 it may be determined if the most recent etching operation is an etching operation on a top deck of memory cells of the memory device. Such a determination may be made, for example, based on a number of decks of memory cells that are to be fabricated and a corresponding number of memory stacks that have been deposited and etched.

If the deck of memory cells is not the top deck, then at block 1635 the processing tools may form an $N^{th}$ electrode layer and an $N^{th}$ self-selecting memory stack on the $N-1^{th}$ set of rows/columns. The operations of block 1635 may be performed according to the methods described with reference to FIGS. 4 through 13. In certain examples, aspects of the operations of block 1635 may be performed by deposition tools as described with reference to FIG. 14.

At block 1640 the processing tools may etch, in an $N^{th}$ etching operation, the $N^{th}$ electrode layer and the $N^{th}$ self-selecting memory stack to form a $N^{th}$ set of rows/columns on the N−$1^{th}$ set of columns, and may etch, in the $N^{th}$ etching operation, portions of the N−$1^{th}$ set of rows/columns to form an N−$1^{th}$ set of memory cells. The operations of block 1640 may be performed according to the methods described with reference to FIGS. 4 through 13. In certain examples, aspects of the operations of block 1640 may be performed by etching tools as described with reference to FIG. 14. The operations of block 1630 may then be repeated.

If the deck of memory cells is the top deck, then at block 1645 the processing tools may form a top electrode layer on the set of rows/columns of the top memory deck. The operations of block 1645 may be performed according to the methods described with reference to FIGS. 4 through 13. In certain examples, aspects of the operations of block 1645 may be performed by deposition tools as described with reference to FIG. 14.

At block 1650 the processing tools may etch, the top electrode layer to form a top set of rows/columns. The operations of block 1650 may be performed according to the methods described with reference to FIGS. 4 through 13. In certain examples, aspects of the operations of block 1650 may be performed by etching tools as described with reference to FIG. 14.

At block 1655 the processing tools also may etch, in the same etching operation used to etch top electrode layer, portions of the set of columns/rows located between adjacent columns/rows of the top electrode layer to form top set of memory cells of the top memory deck. The operations of block 1655 may be performed according to the methods described with reference to FIGS. 4 through 13. In certain examples, aspects of the operations of block 1655 may be performed by etching tools as described with reference to FIG. 14.

FIG. 16 shows a flowchart illustrating a method 1600 for forming self-aligned memory decks in cross-point memory arrays in accordance with various aspects of the present disclosure. The operations of method 1600 may be implemented by processing components as described herein according to the techniques as described with reference to FIG. 14.

At block 1605 the processing tools may form, on a substrate, control circuitry for controlling a plurality of stacked decks of a three-dimensional cross point memory, the plurality of stacked decks comprising N decks. The operations of block 1605 may be performed according to the methods described with reference to FIGS. 1 through 13. In certain examples, aspects of the operations of block 1605 may be performed by deposition, patterning, etching, and planarization tools as described with reference to FIG. 14.

At block 1610 the processing tools may form, over at least a portion of the control circuitry, at least a portion of the plurality of stacked decks using N+1 mask operations and N+1 etch operations. Each mask operation may include one or more mask steps (e.g., two mask steps for a double-patterning mask operation), and each etch operation may include one or more etching steps (e.g., two separate plasma etching steps for an etching operation). The operations of block 1610 may be performed according to the methods described with reference to FIGS. 4 through 13. In certain examples, aspects of the operations of block 1610 may be performed by a deposition, patterning, planarization, and etching tools as described with reference to FIG. 14.

It should be noted that the methods described above describe possible implementations, and that the operations and the steps may be rearranged or otherwise modified and that other implementations are possible. Furthermore, embodiments from two or more of the methods may be combined.

The term "electronic communication" and "coupled" as used herein refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "layer" used herein refers to a stratum or sheet of a geometrical structure. Each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature. The term "layer" also refers to any material initially formed as a stratum or sheet and that remains following one or more other processing operations, such as patterning and/or etching operations, for example.

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

The term "photolithography," as used herein, may refer to the process of patterning using photoresist materials and exposing such materials using electromagnetic radiation. For example, a photoresist material may be formed on a base material by, for example, spin-coating the photoresist on the base material. A pattern may be created in the photoresist by exposing the photoresist to radiation. The pattern may be defined by, for example, a photo mask that spatially delineates where the radiation exposes the photoresist. Exposed photoresist areas may then be removed, for example, by chemical treatment, leaving behind the desired pattern. In some cases, the exposed regions may remain and the unexposed regions may be removed.

Chalcogenide materials may be materials or alloys that include at least one of the elements S, Se, and Te. Phase change materials or variable resistance materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, diffusion, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative control or sensing blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions (e.g., control functions, sensing functions, read/write functions) described herein may be implemented in hardware, software executed by a processor, firmware, or any combination thereof. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:
   a first array of memory cells that each comprise a self-selecting memory storage element, the first array of memory cells comprising a first plurality of columns extending in a first direction, a first plurality of rows extending in a second direction, and a barrier material above and in contact with access lines of the first array, wherein the barrier material above an access line for the first array comprises a shunt for the access line, the shunt having a first thickness below memory cells of the first array and a second thickness different from the first thickness between memory cells of the first array; and
   a second array of memory cells that each comprise a self-selecting memory storage element, the second array of memory cells having a second plurality of columns extending in the first direction and a second plurality of rows extending in the second direction, wherein the second array overlies the first array, each of the second plurality of columns overlay respective columns of the first plurality of columns, and a width of each column of the first plurality of columns is a same width as a width of each respective column of the second plurality of columns.

2. The memory device of claim 1, further comprising:
   a first plurality of access lines coupled with a lower portion of each memory cell of each row of the first plurality of rows;
   a second plurality of access lines coupled with an upper portion of each memory cell of each column of the first plurality of columns and coupled with a lower portion of each memory cell of each column of the second plurality of columns; and
   a third plurality of access lines coupled with an upper portion of each memory cell of each row of the second plurality of rows.

3. The memory device of claim 2, wherein the first plurality of columns, the second plurality of access lines, and the second plurality of columns are self-aligned.

4. The memory device of claim 2, wherein the first plurality of columns, the second plurality of access lines, and the second plurality of columns have a same patterning registration and a same width.

5. The memory device of claim 1, wherein the self-selecting memory storage elements comprise a chalcogenide.

6. The memory device of claim 2, wherein the second plurality of access lines comprise a metal material with an absence of an intra-layer boundary.

7. A memory device, comprising:
   a plurality of pillars arranged in a three-dimensional cross-point architecture with a first access line, a second access line, and a third access line, each pillar comprising:
      a barrier material above and in contact with the first access line, the barrier material above the first access line comprising a shunt for the first access line, wherein the shunt has a first thickness within each of the plurality of pillars and a second thickness different from the first thickness between pillars of the plurality;
      a first memory storage element coupled to the first access line and the second access line; and
      a second memory storage element coupled to the second access line and the third access line,
      wherein the first memory storage element, the second access line, and the second memory storage element are self-aligned in a first direction corresponding to a width of the respective pillar.

8. The memory device of claim 7, wherein the second memory storage element has a second width in a second direction substantially orthogonal to the first direction, the second width different from the width of the respective pillar in the first direction.

9. The memory device of claim 7, wherein each of the first memory storage element and the second memory storage element comprise a self-selecting memory storage element.

10. The memory device of claim 7, wherein the first memory storage element and the second memory storage element each comprise a chalcogenide glass.

11. The memory device of claim 7, wherein the first memory storage element comprises a first deck of a three-dimensional cross point memory architecture and the second memory storage element comprises a second deck of the three-dimensional cross point memory architecture.

12. The memory device of claim 7, wherein the second access line comprises a metal material with an absence of an intra-layer boundary.

13. An electronic memory apparatus, comprising:
   a first memory cell that includes a first self-selecting memory storage element coupled between a first access line and a second access line;
   a second memory cell that includes a second self-selecting memory storage element, the second memory cell coupled between the second access line and a third access line;
   a third memory cell coupled between the first access line and a fourth access line;
   a barrier material above and in contact with the first access line, the barrier material above the first access line having a first thickness below the first memory cell and a second thickness different from the first thickness between the first memory cell and the third memory cell; and
   a controller in electronic communication with the first memory cell and the second memory cell, wherein:
      the second self-selecting memory storage element overlies the first self-selecting memory storage element, and
      the second access line comprises a metal material with an absence of an intra-layer boundary.

14. The electronic memory apparatus of claim 13, wherein the barrier material above the first access line comprises a shunt for the first access line.

15. The electronic memory apparatus of claim 13, wherein the first self-selecting memory storage element, the second self-selecting memory storage element and the second access line have a same width in a first direction.

16. The electronic memory apparatus of claim 13, wherein the second self-selecting memory storage element has a second width in a second direction, substantially orthogonal to a first direction, that is different than a first width in the first direction.

17. The electronic memory apparatus of claim 13, wherein the first self-selecting memory storage element, the second self-selecting memory storage element and the second access line are self-aligned in a first direction.

* * * * *